United States Patent
Ishizu et al.

(10) Patent No.: US 10,930,323 B2
(45) Date of Patent: Feb. 23, 2021

(54) SEMICONDUCTOR DEVICE WITH REDUCED POWER CONSUMPTION AND OPERATION METHOD THEREOF, ELECTRONIC COMPONENT, AND ELECTRONIC DEVICE

(71) Applicant: Semiconductor Energy Laboratory Co., Ltd., Atsugi (JP)

(72) Inventors: Takahiko Ishizu, Atsugi (JP); Toshihiko Saito, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/475,906

(22) PCT Filed: Jan. 9, 2018

(86) PCT No.: PCT/IB2018/050115
§ 371 (c)(1),
(2) Date: Jul. 3, 2019

(87) PCT Pub. No.: WO2018/130929
PCT Pub. Date: Jul. 19, 2018

(65) Prior Publication Data
US 2019/0355397 A1  Nov. 21, 2019

(30) Foreign Application Priority Data
Jan. 10, 2017  (JP) .............................. JP2017-001575

(51) Int. Cl.
*G11C 14/00* (2006.01)
*G11C 5/14* (2006.01)
*G06F 1/3234* (2019.01)

(52) U.S. Cl.
CPC ............ *G11C 5/148* (2013.01); *G06F 1/3275* (2013.01); *G11C 14/0054* (2013.01)

(58) Field of Classification Search
CPC .................................................. G11C 14/0054
(Continued)

(56) References Cited

U.S. PATENT DOCUMENTS 6,885,057 B2  4/2005  Osada et al.
6,998,674 B2  2/2006  Osada et al.
(Continued)

FOREIGN PATENT DOCUMENTS

JP  2003-060077 A  2/2003
JP  2003-123479 A  4/2003
(Continued)

OTHER PUBLICATIONS

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.
(Continued)

*Primary Examiner* — Hoai V Ho
(74) *Attorney, Agent, or Firm* — Robinson Intellectual Property Law Office; Eric J. Robinson

(57) ABSTRACT

Power consumption of a semiconductor device is reduced efficiently. The semiconductor device includes a power management unit, a cell array, and a peripheral circuit for driving the cell array. The cell array includes a word line, a bit line pair, a memory cell, and a backup circuit for backing up data in the memory cell. A row circuit and a column circuit are provided in a first power domain capable of power gating, and the cell array is provided in a second power domain capable of power gating. In the operation mode of a memory device, a plurality of low power consumption modes, which have lower power consumption than the standby mode, are set. The power management unit selects one from the plurality of low power consumption modes and
(Continued)

performs control for bringing the memory device into the selected low power consumption mode.

25 Claims, 22 Drawing Sheets

(58) Field of Classification Search
USPC .................................................. 365/185.08
See application file for complete search history.

(56) References Cited

U.S. PATENT DOCUMENTS

| | | |
|---|---|---|
| 7,087,942 B2 | 8/2006 | Osada et al. |
| 7,388,238 B2 | 6/2008 | Osada et al. |
| 7,569,881 B2 | 8/2009 | Osada et al. |
| 7,964,484 B2 | 6/2011 | Osada et al. |
| 8,125,017 B2 | 2/2012 | Osada et al. |
| 8,232,589 B2 | 7/2012 | Osada et al. |
| 8,437,179 B2 | 5/2013 | Osada et al. |
| 8,797,791 B2 | 8/2014 | Osada et al. |
| 9,001,549 B2 | 4/2015 | Onuki |
| 9,111,636 B2 | 8/2015 | Osada et al. |
| 9,443,564 B2 | 9/2016 | Ishizu et al. |
| 9,530,485 B2 | 12/2016 | Osada et al. |
| 9,627,010 B2 | 4/2017 | Ishizu et al. |
| 9,824,749 B1* | 11/2017 | Nautiyal ............... G11C 11/419 |
| 2002/0179940 A1 | 12/2002 | Osada et al. |
| 2011/0273925 A1* | 11/2011 | Yamamoto ......... G11C 14/0081 |
| | | 365/154 |
| 2013/0301332 A1 | 11/2013 | Onuki |
| 2016/0217848 A1* | 7/2016 | Ishizu .................. G11C 11/418 |
| 2017/0062044 A1 | 3/2017 | Ishizu et al. |
| 2017/0229179 A1* | 8/2017 | Sugahara ........... G11C 14/0081 |

FOREIGN PATENT DOCUMENTS

| | | |
|---|---|---|
| JP | 2013-254945 A | 12/2013 |
| JP | 2016-139450 A | 8/2016 |

OTHER PUBLICATIONS

International Search Report Written Opinion (Application (Application No. PCT/IB2018/050115) dated Mar. 13, 2018.
Written Opinion (Application No. PCT/IB2018/050115) dated Mar. 13, 2018.

* cited by examiner

SEMICONDUCTOR DEVICE WITH REDUCED POWER CONSUMPTION AND OPERATION METHOD THEREOF, ELECTRONIC COMPONENT, AND ELECTRONIC DEVICE

TECHNICAL FIELD

The specification, drawings, and scope of claim of the present application (hereinafter referred to as "this specification and the like") relate to a semiconductor device, an operation method thereof, and the like. Note that one embodiment of the present invention is not limited to the exemplified technical field.

In this specification and the like, a semiconductor device refers to a device that utilizes semiconductor characteristics, and means a circuit including a semiconductor element (a transistor, a diode, a photodiode, and the like), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic component, an electronic device, and the like themselves are semiconductor devices in some cases, or include a semiconductor device in some cases.

BACKGROUND ART

A reduction in power consumption of electronic devices is regarded as important. Thus, a reduction in power consumption of integrated circuits (ICs) such as CPUs is a major challenge in circuit design. The power consumption of ICs is broadly classified into operating power consumption (dynamic power) and non-operating (standby) power consumption (static power). Dynamic power increases when operation frequency is increased for higher performance. Most of the static power is power consumed by the leakage current of transistors. The leakage current includes sub-threshold leakage current, gate tunnel leakage current, gate-induced drain leakage (GIDL) current, and junction tunnel leakage current. These leakage currents increase with scaling down of transistors. Thus, an increase in power consumption is a large barrier to high performance and high integration of ICs.

In order to reduce power consumption of a semiconductor device, circuits that do not need to operate are stopped by power gating or clock gating. Power gating has the effect of eliminating standby power because supply of power is stopped. In order to perform power gating of a CPU, it is necessary to back up contents stored in a register or a cache to a nonvolatile memory.

A transistor in which a channel formation region is formed of a metal oxide (hereinafter referred to as an "oxide semiconductor transistor" or an "OS transistor" in some cases) is known. A backup circuit capable of retaining data even when powered off, by taking advantage of a feature of extremely low off-state current of the OS transistor, has been proposed. For example, Patent Documents 1 and 2 and Non-Patent Document 1 disclose an SRAM (static random access memory) including a backup circuit that uses an OS transistor.

PRIOR ART DOCUMENT

Patent Document

[Patent Document 1] Japanese Published Patent Application No. 2015-195075
[Patent Document 2] Japanese Published Patent Application No. 2016-139450

Non-Patent Document

[Non-Patent Document 1] T. Ishizu et al., "SRAM with C-Axis Aligned Crystalline Oxide Semiconductor: Leakage Power Reduction Technique for Microprocessor Caches," Int. Memory Workshop, 2014, pp. 106-103.

SUMMARY OF THE INVENTION

Problems to be Solved by the Invention

An object of one embodiment of the present invention is to provide a memory device capable of power gating or to reduce power consumption of a memory device efficiently.

Note that description of the plurality of objects does not mutually preclude the existence. One embodiment of the present invention does not necessarily achieve all of these objects described above. Objects other than those listed above are apparent from the description of this specification and the like, and such objects could be objects of one embodiment of the present invention.

Means for Solving the Problems

One embodiment of the present invention is a memory device including a power management unit, a cell array, and a peripheral circuit for driving the cell array. The cell array includes a word line, a bit line pair, a memory cell, and a backup circuit for backing up data in a memory cell. The peripheral circuit is provided in a first power domain capable of power gating, and the cell array is provided in a second domain capable of power gating. As the operation modes of the memory device, a plurality of low power consumption modes, which have lower power consumption than the standby mode, are set. The power management unit performs control for selecting one from the plurality of low power consumption modes and bringing the memory device into the selected low power consumption mode.

In this specification and the like, ordinal numbers such as "first", "second", and "third" may be used to show the order. Alternatively, ordinal numbers are used to avoid confusion among components in some cases, and in those cases, ordinal numbers do not limit the number or the order of components. For example, it is possible to replace the term "first" with the term "second" or "third" in describing one embodiment of the present invention.

In the case where there is a description "X and Y are connected" in this specification and the like, the case where X and Y are electrically connected, X and Y are functionally connected, and X and Y are directly connected are regarded as being disclosed in this specification and the like. Accordingly, without being limited to a predetermined connection relation, for example, a connection relation shown in drawings or texts, a connection relation other than one shown in drawings or texts is included in the drawings or the texts. Each of X and Y denotes an object (e.g., a device, an element, a circuit, a wiring, an electrode, a terminal, a conductive film, or a layer).

A transistor includes three terminals called a gate, a source, and a drain. The gate functions as a control terminal for controlling the conducting state of the transistor. Depending on the type of the transistor or levels of potentials supplied to the terminals, one of two input/output terminals that function as a source or a drain functions as a source and the other functions as a drain. Therefore, the terms "source" and "drain" can be switched and used in this specification and the like. In this specification and the like, the two terminals other than the gate may be referred to as a first terminal and a second terminal.

A voltage usually refers to a potential difference between a given potential and a reference potential (e.g., a ground potential (GND) or a source potential). Thus, a voltage can be replaced with a potential. Note that a potential is relative. Thus, the expression "GND" does not necessarily mean 0 V.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, the term "film" and the term "layer" can be interchanged depending on the case or circumstances. For example, the term "conductive layer" can be replaced with the term "conductive film" in some cases. For example, the term "insulating film" can be replaced with the term "insulating layer" in some cases.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases.

In this specification and the like, a metal oxide including nitrogen is included in a metal oxide used in a channel formation region of a transistor, unless otherwise specified. Note that a metal oxide including nitrogen may be called a metal oxynitride.

Effect of the Invention

One embodiment of the present invention can provide a memory device capable of power gating or to reduce power consumption of a memory device efficiently.

The description of a plurality of effects does not disturb the existence of other effects. Furthermore, one embodiment of the present invention does not necessarily obtain all the effects listed above. In one embodiment of the present invention, an object other than the above objects, an effect other than the above effects, and a novel feature are apparent from the description of the specification and the drawings.

MODE FOR CARRYING OUT THE INVENTION

Figure 1:
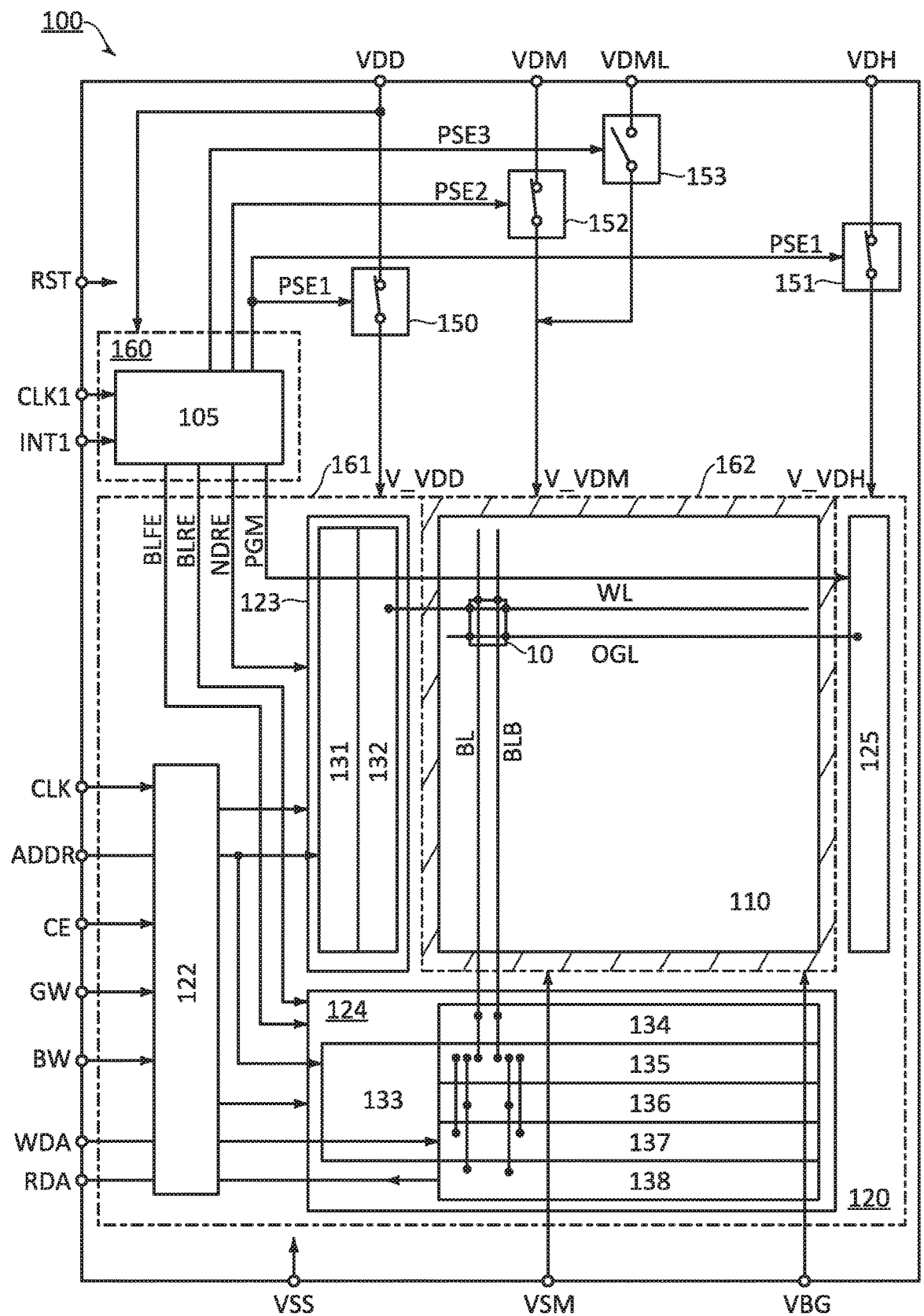
FIG. 1 A block diagram illustrating a configuration example of a memory device.

Embodiments of the present invention are described below. Note that one embodiment of the present invention is not limited to the following description. It is readily appreciated by those skilled in the art that modes and details of the present invention can be modified in various ways without departing from the spirit and scope of the present invention. Therefore, one embodiment of the present invention should not be construed as being limited to the description in the following embodiments.

A plurality of embodiments described below can be combined as appropriate. In addition, in the case where a plurality of structure examples (including a manufacturing method example, an operating method example, and the like) are given in one embodiment, the structure examples can be combined with each other as appropriate, and can be combined with one or more structure examples described in the other embodiments as appropriate.

In the drawings, the same elements, elements having similar functions, elements formed of the same material, elements formed at the same time, or the like are sometimes denoted by the same reference numerals, and description thereof is not repeated in some cases.

In the drawings, the size, the layer thickness, the region, and the like are exaggerated for clarity in some cases. Therefore, the size, the layer thickness, or the region is not limited to the scale. The drawings schematically show ideal examples, and shapes, values, or the like are not limited to those shown in the drawings. For example, variation in signal, voltage, or current due to noise or variation in signal, voltage, or current due to difference in timing can be included.

In this specification, terms for describing arrangement, such as "over" and "under", are used for convenience to describe the positional relationship between components with reference to drawings in some cases. Furthermore, the positional relation between components is changed as appropriate in accordance with a direction in which each component is described. Thus, terms for the description are not limited to those used in this specification, and the description can change appropriately depending on the situation.

Embodiment 1

In this embodiment, an SRAM capable of power gating is described as an example of a memory device.

<<Memory Device 100>>

FIG. 1 is a functional block diagram showing a configuration example of a memory device. A memory device 100 shown in FIG. 1 includes a power management unit (PMU) 105, a cell array 110, a peripheral circuit 120, and power switches 150-153.

The memory device 100 performs reading of data in the cell array 110 and writing of data to the cell array 110. Data RDA denote read data, and data WDA denote write data. Clock signals CLK1 and CLK, an address signal ADDR, and signals RST, INT1, CE, GW, and BW are input to the memory device 100. The signal RST is a reset signal and input to a PMU 105 and the peripheral circuit 120. The signal INT1 is an interrupt signal. The signal CE is a chip enable signal, the signal GW is a global write enable signal, and the signal BW is a byte write enable signal.

Voltages VDD, VDH, VDM, VDML, VSS, VSM, and VBG are applied to the memory device 100. The voltages VDD, VDM, VDML, and VDH are high-level power supply voltages. The voltages VSS and VSM are low-level power supply voltages, and are GND (ground potential) or 0 V, for example.

The cell array 110 includes cells 10, word lines WL, bit lines BL and BLB, and wirings OGL. Note that the bit lines BL and BLB can also be referred to as local bit lines. A pair of wirings that is made up of the bit line BL and the bit line BLB arranged in the same column is referred to as a bit line pair (BL and BLB) in some cases.

The peripheral circuit 120 includes a controller 122, a row circuit 123, a column circuit 124, and a backup and recovery driver 125.

The controller 122 has a function of performing logical operation of the signals CE, GW, and BW to determine an operation mode, and a function of generating control signals for the row circuit 123 and the column circuit 124 for executing the determined operation mode. The controller 122 may be provided with a register in which the address signal ADDR, the signals CE, GW, and BW, and the data RDA and WDA are temporarily stored.

The row circuit 123 includes a row decoder 131 and a word line driver 132. The row decoder 131 decodes the address signal ADDR and generates control signals for the word line driver 132. The word line driver 132 selects the word line in a row that is specified by the address signal ADDR.

The column circuit 124 includes a column decoder 133, a precharge circuit 134, a local bit line MUX (multiplexer) 135, a sense amplifier 136, a write driver 137, and an output driver 138. The column circuit 124 writes and reads data to and from the bit line BL in a column specified by the address signal ADDR. The circuit configuration of the column circuit 124 is described later.

In the memory device 100, each circuit, each signal, and each voltage can be appropriately selected as needed. Alternatively, another circuit or another signal may be added. Structures (e.g., bit widths) of an input signal and an output signal of the memory device 100 are determined on the basis of the operation mode of the memory device 100, the configuration of the cell array 110, and the like.

<Power Domain>

The memory device 100 includes a plurality of power domains. In the example of FIG. 1, power domains 160, 161, and 162 are provided. In the power domain 160, power gating is not performed. In the power domains 161 and 162, power gating is performed. The voltage VSS is applied to each of the power domains 160, 161, and 162 not through any power switch.

In the power domain 160, the PMU 105 is provided. The voltage VDD is applied to the power domain 160 not through any power switch.

In the power domain 161, the peripheral circuit 120 and virtual voltage lines V_VDD and V_VDH are provided. The power switch 150 controls application of the voltage VDD to the virtual voltage line V_VDD (hereinafter referred to as a V_VDD line). The power switch 151 controls application of the voltage VDH to the virtual voltage line V_VDH (hereinafter referred to as a V_VDH line). The voltage VDH is used in the backup and recovery driver 125.

In the power domain 162, the cell array 110 and a virtual voltage line V_VDM (hereinafter referred to as a V_VDM line) are provided. The power switch 152 controls application of the voltage VDM to the V_VDM line. The power switch 153 controls application of the voltage VDML to the V_VDM line. The voltage VDML is lower than the voltage VDM. The voltages VSM and VBG are applied to the power domain 162 not through any power switch.

<PMU>

The PMU 105 controls the memory device 100 in a low power consumption mode. The clock signal CLK1 and the signal INT1 are input to the PMU 105. The signal INT1 is an interrupt signal. A plurality of kinds of interrupt signals may be input to the PMU 105. The PMU 105 generates signals PSE1, PSE2, PSE3, BLFE, BLRE, NDRE, and PGM in response to the signals CLK1 and INT1.

The signals PSE1, PSE2, and PSE3 are power switch enable signals. The signal PSE1 controls the on/off of the power switches 150 and 151, the signal PSE2 controls the on/off of the power switch 152, and the signal PSE3 controls the on/off of the power switch 153. Here, when the signal PSE1 is at "H", the power switch 150 is on, and when the signal PSE1 is at "L", the power switch 150 is off. The same applies to the on/off control of the other power switches.

The signals NDRE, BLFE, BLRE, and PGM are control signals used in a low power consumption mode. The signal NDRE is a node reset enable signal and controls the reset operation of nodes Q and Qb in the cell 10. The signal NDRE is input to the row circuit 123. The row circuit 123 sets all the word lines WL of the cell array 110 to the selected state in response to the signal NDRE. The signals BLFE and BLRE are input to the column circuit 124. The signal BLFE is a bit line floating enable signal and controls the operation of bringing the bit line pair (BL and BLB) into a floating state. The signal BLRE is a bit line reset enable signal and controls the reset operation of the bit line pair (BL and BLB).

The signal PGM is input to the backup and recovery driver 125. The backup and recovery driver 125 sets all the wirings OGL of the cell array 110 to the selected state in response to the signal PGM. For example, the backup and recovery driver 125 shifts the level of the signal PGM to generate a selection signal of the wirings OGL. The high-level voltage of the selection signal is VDH. The voltage VDH is higher than the voltage VDD. In the case where the high-level voltage of the selection signal can be set to VDD, the power switch 151 is unnecessary.

<Cell>

Figure 2A:
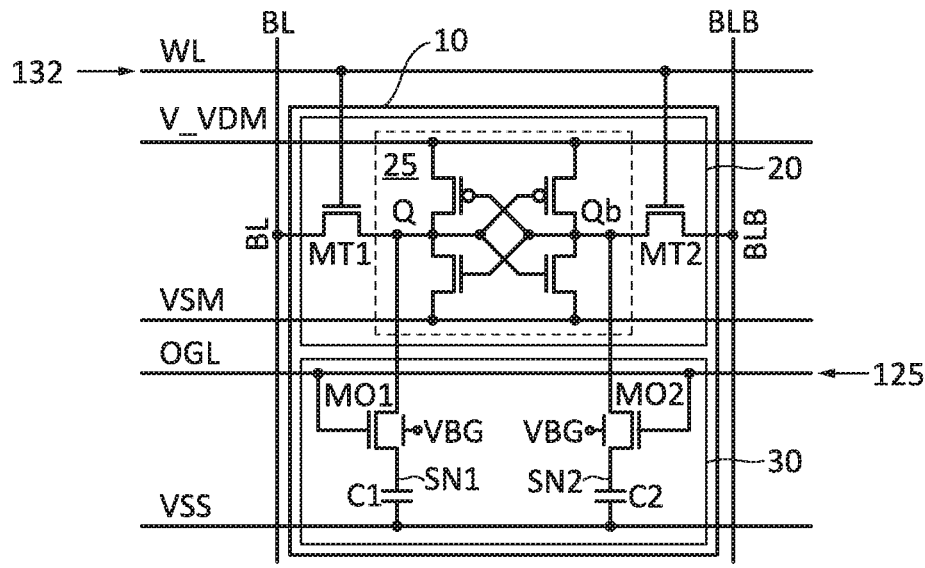
FIG. 2 A: A circuit diagram illustrating a configuration example of a cell. B: A timing chart showing an operation example of a memory device.

FIG. 2A illustrates a circuit configuration example of the cell 10. The cell 10 includes a memory cell 20 and a backup circuit 30. The memory cell 20 has the same circuit configuration as a standard 6T (transistor) SRAM cell and is composed of a bistable circuit 25 and transistors MT1 and MT2. The bistable circuit 25 is electrically connected to the V_VDM line and a power supply line for applying the voltage VSM (hereinafter referred to as a VSM line).

In the example of FIG. 2A, the bistable circuit 25 is a latch circuit composed of two CMOS inverter circuits. The nodes Q and Qb are connection portions of input terminals and output terminals of the two CMOS inverter circuits and are retention nodes for complementary data. When the nodes Q/Qb are set to "H"/"L" or the nodes Q/Qb are set to "L"/"H", the bistable circuit 25 is stabilized. The transistors MT1 and MT2 are transfer transistors. The transistor MT1 controls continuity between the bit line BL and the node Q, and the transistor MT2 controls continuity between the bit line BLB and the node Qb.

The backup circuit 30 is a circuit for backing up data in the memory cell 20. Each of the cells 10 is provided with the backup circuit 30 to enable power gating of the power domain 162.

The backup circuit 30 is electrically connected to a voltage line for applying the voltage VSS (hereinafter referred to as a VSS line) and a voltage line for applying the voltage VBG (hereinafter referred to as a VBG line). The backup circuit 30 is composed of two 1T1C (capacitor) DRAM cells. The backup circuit 30 includes nodes SN1 and SN2, transistors MO1 and MO2, and capacitors C1 and C2. The nodes SN1 and SN2 are retention nodes for retaining data in the nodes Q and Qb. The capacitors C1 and C2 are storage capacitors for holding the voltages of the nodes SN1 and SN2. The transistor MO1 controls continuity between the node Q and the node SN1, and the transistor MO2 controls continuity between the node Qb and the node SN2.

In order to retain data in the backup circuit 30 for a long time, transistors whose off-state current is extremely low are selected as the transistors MO1 and MO2. OS transistors are preferably used as the transistors MO1 and MO2. When OS transistors are used as the transistors MO1 and MO2, leakage of charges from the capacitors C1 and C2 can be suppressed, so that the backup circuit 30 can retain data for a long time. In other words, the backup circuit 30 can function as a nonvolatile memory circuit.

A metal oxide has a band gap of greater than equal to 2.5 eV; thus, an OS transistor has a low leakage current due to thermal excitation and, as described above, its off-state current is extremely low. The off-state current of the OS transistor that is normalized by channel width can be reduced to approximately greater than or equal to several yoctoamperes per micrometer and less than or equal to several zeptoamperes per micrometer. Examples of a metal oxide that can be used in a channel formation region include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn, or Hf). In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

When the transistors MO1 and MO2 are each an OS transistor, the backup circuit 30 can be stacked over the memory cell 20 including Si transistors; thus, the area overhead of the cell 10 due to provision of the backup circuit 30 can be reduced.

The transistors MO1 and MO2 each include a back gate, and the back gate is electrically connected to the VBG line. For example, the voltage VBG is a voltage that shifts the threshold voltages of the transistors MO1 and MO2 in the positive direction. Alternatively, the backup and recovery driver 125 may have a function of varying a voltage to be applied to the VBG line, depending on the operation of the backup circuit 30. The transistors MO1 and MO2 can each be an OS transistor with no back gate.

<Column Circuit>

A circuit configuration example of the column circuit 124 is described with reference to FIG. 3.

(Precharge Circuit 134)

The precharge circuit 134 includes precharge circuits 51 and 52. The precharge circuits 51 and 52 are controlled by signals PRCH1 and PRCH2. The precharge circuit 51 precharges the bit line pair (BL and BLB) to a voltage Vpr1, and the precharge circuit 52 precharges the bit line pair (BL and BLB) to a voltage Vpr2. The precharge circuits 51 and 52 each have a function of an equalizer that smooths the voltages of the bit line pair (BL and BLB).

The precharge circuit 51 is a circuit for precharging the bit line pair (BL and BLB) in a normal operation mode and a standby mode. On the other hand, the precharge circuit 52 is a circuit for precharging the bit line pair (BL and BLB) in a recovery state and a backup state. The voltage Vpr2 is a precharge voltage for recovery and a precharge voltage for backup.

(Sense Amplifier 136)

Signals PRCH3 and SNS are input to the sense amplifier 136. The sense amplifier 136 includes a local bit line pair (LRBL and LRBLB), a precharge circuit 53, a sense amplifier 55, an RS (reset-set) latch circuit 56, inverter circuits 57 and 58, and transistors MP3 and MP4.

LRBL and LRBLB are each a local read bit line. One local bit line pair (LRBL and LRBLB) is provided for a plurality of bit line pairs (BL and BLB). Here, one local bit line pair (LRBL and LRBLB) is provided for four bit line pairs (BL and BLB).

The precharge circuit 53 precharges the local bit line pair (LRBL and LRBLB) to the voltage Vpr1 in response to the signal PRCH3. The precharge circuit 53 has a function of an equalizer that smooths the voltages of the bit line pair (LRBL and LRBLB).

The sense amplifier 55 senses data read from the cell 10 by amplifying a voltage difference between the local bit line pair (LRBL and LRBLB). The sense amplifier 55 includes a transistor MN3 and a latch circuit 55a and is electrically connected to the VSS line and the V_VDD line. The latch circuit 55a is composed of two inverter circuits. Nodes QS and QSb are retention nodes of the latch circuit 55a and are electrically connected to inputs of the RS latch circuit 56. Data sensed by the sense amplifier 55 are retained in the RS latch circuit 56. The RS latch circuit 56 is composed of two NAND circuits. Data LATOB and LATO retained in the RS latch circuit 56 are input to the inverter circuits 57 and 58.

An output of the inverter circuit 57 (data DO) and an output of the inverter circuit 58 (data DOB) are input to the output driver 138.

The transistors MP3 and MP4 control continuity between the local bit line pair (LRBL and LRBLB) and the sense amplifier 55 and continuity between the local bit line pair (LRBL and LRBLB) and the RS latch circuit 56. The on/off of the transistors MP3 and MP4 is controlled by the signal SNS. The on/off of the transistor MN3 is also controlled by the signal SNS. The signal SNS is a sense amplifier enable signal for activating the sense amplifier 55. When the sense amplifier 55 is active, there is no continuity between the sense amplifier 55 and the local bit line pair (LRBL and LRBLB).

(Write Driver 137)

The write driver 137 is a circuit for writing data to a local bit line pair (LWBL and LWBLB). The write driver 137 includes an inverter circuit 59.

LWBL and LWBLB are each a local write bit line. One local bit line pair (LWBL and LWBLB) is provided for a plurality of bit line pairs (BL and BLB). Here, one local bit line pair (LWBL and LWBLB) is provided for four bit line pairs (BL and BLB).

Data DIN are write data. The data DIN are input to the local bit line LWBL and the inverter circuit 59. An output of the inverter circuit 59 (data DINB) is input to the local bit line LWBLB.

(Local Bit Line MUX 135)

The local bit line MUX 135 includes a MUX 135r and a MUX 135w, and is supplied with signals RDE[3:0] and WTE[15:0]. The signal RDE[3:0] is a read enable signal, and the signal WTE[15:0] is a write enable signal.

The MUX 135r selects the bit line pair (BL and BLB) of a column from which data are read. A plurality of bit line pairs (BL and BLB) selected by the MUX 135r are electrically connected to respective local bit line pairs (LRBL and LRBLB).

The MUX 135r is composed of transistors MP1 and MP2. Any one bit of the signal RDE[3:0] is input to the transistors MP1 and MP2. The transistors MP1 and MP2 function as switches for controlling continuity between the bit line pair (BL and BLB) and the local bit line pair (LRBL and LRBLB).

The MUX 135w selects the bit line pair (BL and BLB) of a column to which data are written. A plurality of bit line pairs (BL and BLB) selected by the MUX 135w are electrically connected to respective local bit line pairs (LWBL and LWBLB). The MUX 135w is composed of transistors MN1 and MN2. Any one bit of the signal WTE[15:0] is input to the transistors MN1 and MN2. The transistors MN1 and MN2 function as switches for controlling continuity between the bit line pair (BL and BLB) and the local bit line pair (LWBL and LWBLB).

Figure 3:
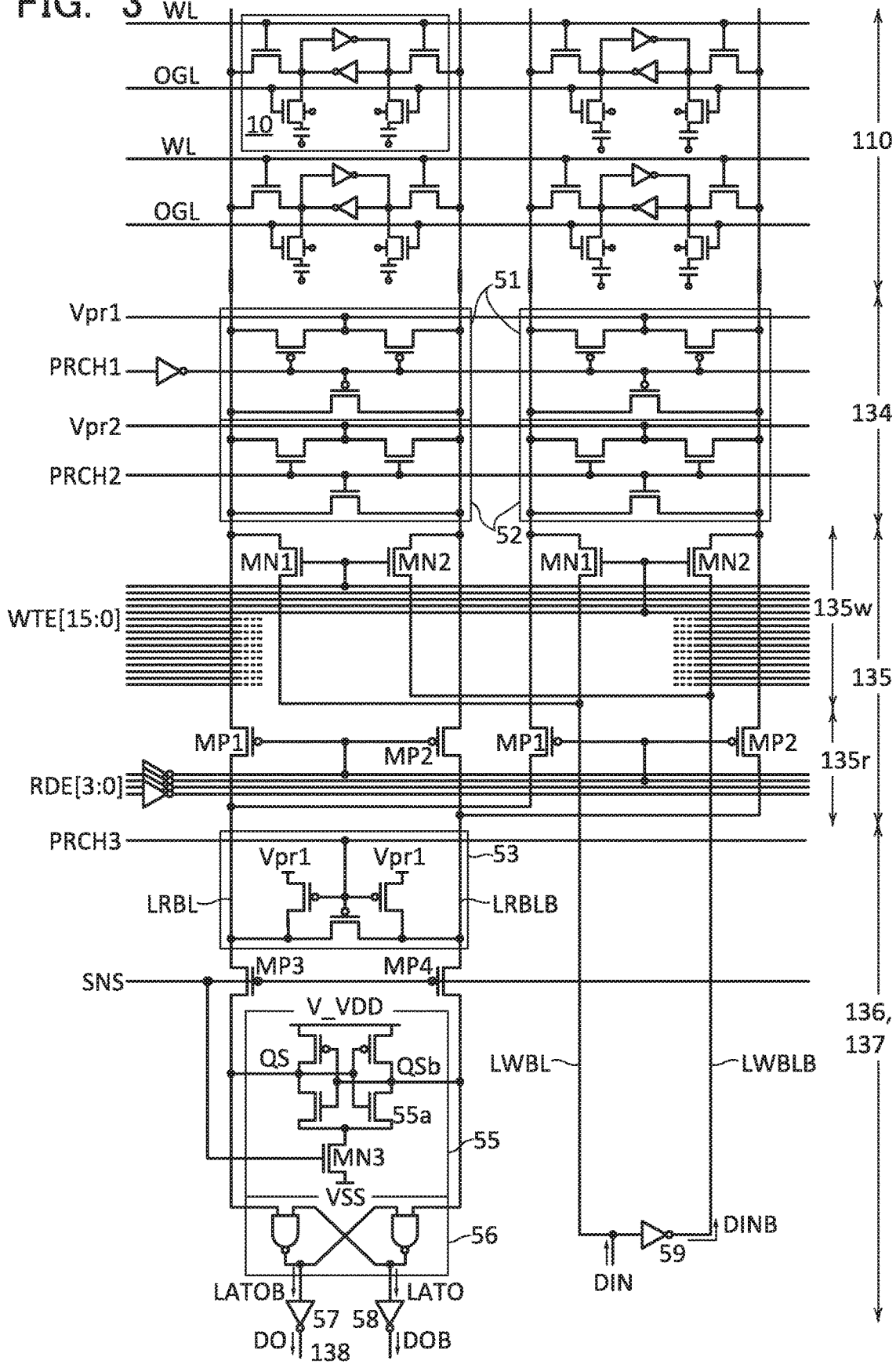
FIG. 3 A circuit diagram illustrating a configuration example of a column circuit.

The circuit configuration of the column circuit 124 is not limited to that in FIG. 3. It is changed as appropriate in accordance with the input signal, the input voltage, or the like. In the example of FIG. 3, the precharge circuit 52 is composed of three n-channel transistors, but may be composed of three p-channel transistors.

<<Operation Mode>>

Next, the operation mode, especially the low power consumption mode, of the memory device 100 is described. Table 1 shows a truth table of the memory device 100. Here, the bit width of the signal BW is 4 bits, and the bit width of the data WDA and RDA is 32 bits.

TABLE 1

| Operation mode | RST | CE | GW | BW[0] | BW[1] | BW[2] | BW[3] | BLFE | PSE1 | PSE2 | PSE3 |
|---|---|---|---|---|---|---|---|---|---|---|---|
| Reset | L | X | X | X | X | X | X | L | H | H | L |
| Stand-by | H | L | X | X | X | X | X | L | H | H | L |
| Word Write | H | H | H | H | H | H | H | L | H | H | L |
| Half Word Write | H | H | H | H | H | L | L | L | H | H | L |
| Byte 0 Write | H | H | H | H | L | L | L | L | H | H | L |
| Read | H | H | L | L | L | L | L | L | H | H | L |
| Bit Line Floating | H | L | X | X | X | X | X | H | H | H | L |
| Sleep | H | L | X | X | X | X | X | H | H | L | H |
| PG for Cell Array Domain | H | L | X | X | X | X | X | H | H | L | L |
| PG for All Domains | L | L | X | X | X | X | X | L | L | L | L |

PG: Power Gating

In a byte 0 write mode, operation of writing 1 byte (8 bit) data assigned to a signal BW[0] is performed. For example, data WDA[7:0] are written in the byte 0 write mode. In byte write operation, when BW[1], BW[2], or BW[3] is "H", the write data are WDA[15:8], WDA[23:16], and WDA[31:24], respectively.

<Power Gating Sequence>

Figure 2B:
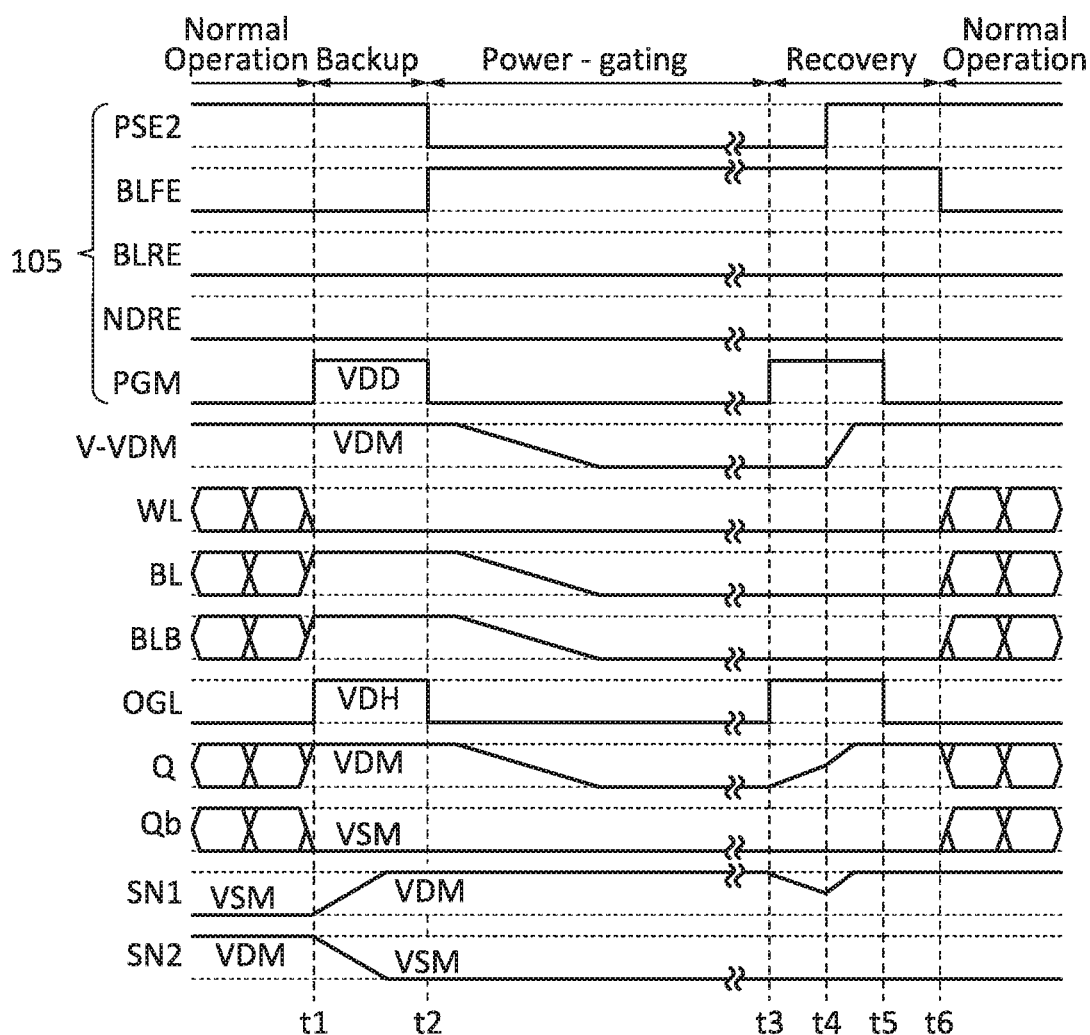

Each of the cells 10 is provided with the backup circuit 30 so that power gating of the power domain 162 can be performed. FIG. 2B illustrates an example of the power gating sequence of the power domain 162. In FIG. 2B, t1, t2, and the like each represent time.

(Normal Operation)

Until t1, the state of the memory device 100 is a normal operation state (a write state or a read state). The memory device 100 performs normal operation similar to that of a single-port SRAM. While the signal NDRE is at "L", the row circuit 123 operates in response to a control signal of the controller 122. While the signals BLFE and BLRE are at "L", the column circuit 124 operates in response to a control signal of the controller 122. The power switches 150-152 are on, and the power switch 153 is off.

(Backup)

When the signal PGM at "H" is input to the backup and recovery driver 125 at t1, the backup operation starts. Here, at t1, the nodes Q/Qb are at "H"/"L", and the nodes SN1/SN2 are at "L"/"H". Since the word lines WL in all of the rows are at "L", all the cells 10 are in a non-selected state.

The backup and recovery driver 125 shifts the level of the signal PGM to generate selection signals and outputs all the selection signals to the wiring OGL. The transistors MO1 and MO2 of the backup circuit 30 are turned on, whereby the data in the nodes Q and Qb at t1 are written to the nodes SN1 and SN2. The voltage of the node SN1 increases from VSM to VDM, and the voltage of the node SN2 decreases from VDM to VSM. When the signal PGM is set to "L" at t2, the backup operation is completed.
(Power-Gating (PG))

The PMU 105 sets the signal PSE2 to "L" at t2, whereby power gating of the power domain 162 starts. The power switch 152 is turned off; thus, the voltage of the V_VDM line decreases from VDM to VSM. The memory cell 20 is inactivated by the decrease in the voltage of the V_VDM line. Although data in the memory cell 20 are lost, the backup circuit 30 retains data.

Here, while the power domain 162 is powered off, the bit line pair (BL and BLB) is in a floating state. Thus, the PMU 105 sets the signal BLFE to "H" at the timing when the signal PSE2 is set to "L".

After t1, the transistors MN1, MN2, MP1, and MP2 in the local bit line MUX 135 are off regardless of the logic of the signal BLFE. When the signal BLFE at "H" is input to the column circuit 124, the precharge circuits 51 and 52 of the precharge circuit 134 are turned off; consequently, all the bit line pairs (BL and BLB) of the cell array 110 are brought into a floating state.
(Recovery)

Recovery operation refers to operation of recovering data of the memory cell 20 with the use of data retained in the backup circuit 30. In the recovery operation, the bistable circuit 25 functions as a sense amplifier for detecting data retained in the memory cell 20. In the recovery operation, the bistable circuit 25 functions as a sense amplifier for detecting data in the nodes Q/Qb.

At t3, the PMU 105 generates the signal PGM at "H" to start the recovery operation. The transistors MO1 and MO2 are turned on; thus, the charge in the capacitor C1 is distributed to the node Q and the node SN1 and the charge in the capacitor C2 is distributed to the node Qb and the node SN2.

At t4, the power switch 152 is turned on and the voltage VDM is input to the V_VDM line. The V_VDM line is charged; then, the bistable circuit 25 becomes active. The bistable circuit 25 amplifies a voltage difference between the node Q and the node Qb. Finally, the voltages of the nodes Q and SN1 become VDM, and the voltages of the nodes Qb and SN2 become VSM. In other words, the states of the nodes Q/Qb return to the states at t1 ("H"/"L"). The PMU 105 sets the signal PGM to "L" at t5 and sets the signal BLFE to "L" at t6 to terminate the recovery operation.
<<Low Power Consumption Mode>>

Figure 4:
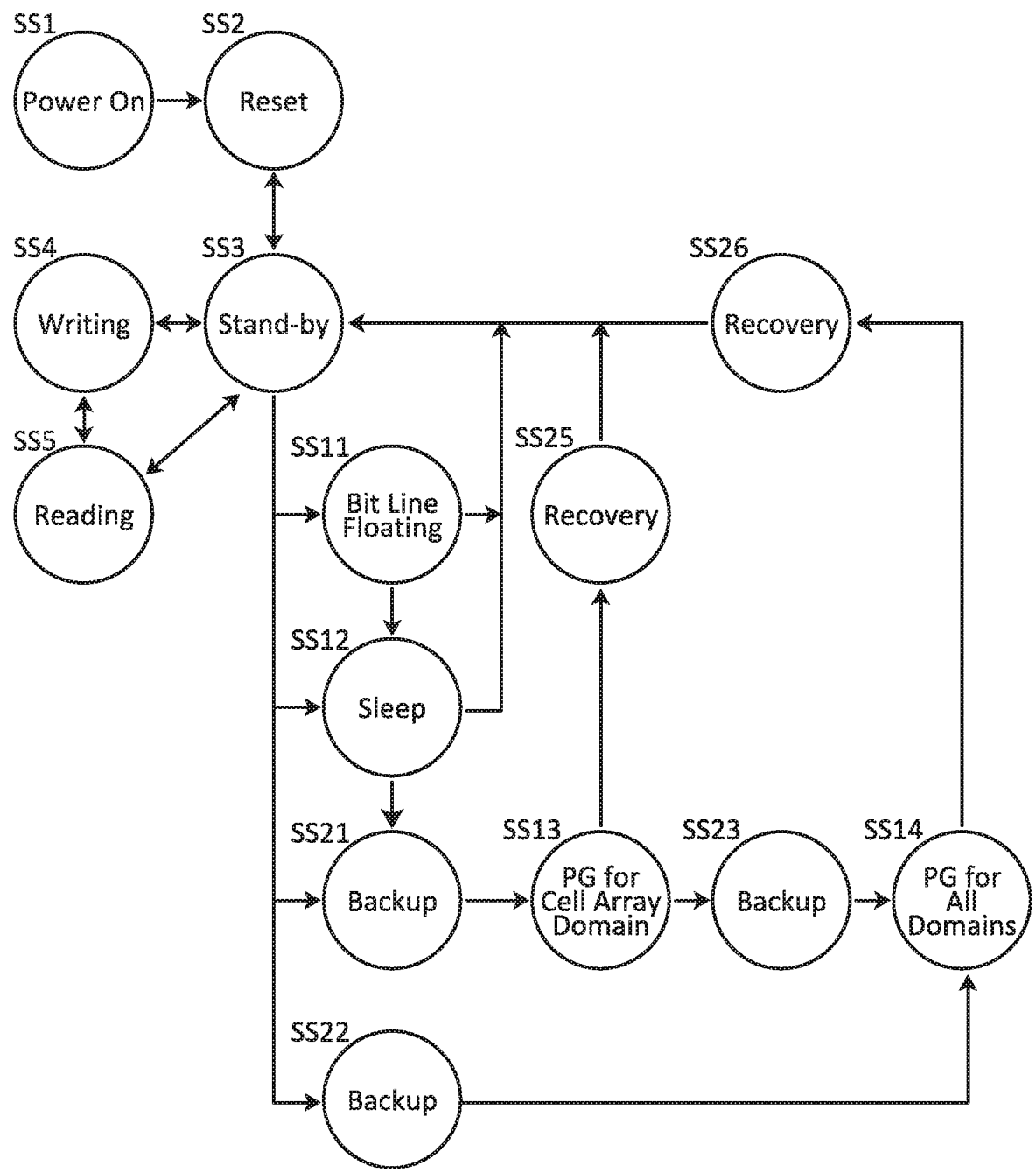
FIG. 4 A state transition diagram of a memory device.

FIG. 4 shows a state transition diagram of the memory device 100. The memory device 100 has the followings states: a power on (Power On) state SS1, a reset (Reset) state SS2, a standby (Stand-by) state SS3, a write (Writing) state SS4, a read (Reading) state SS5, a bit line floating (Bit Line Floating) state SS11, a sleep (Sleep) state SS12, a cell array domain power gating (PG for Cell Array (CA) Domain) state SS13, an all domain PG (PG for All Domains) state SS14, backup (Backup) states SS21-SS23, and recovery (Recovery) states SS25 and SS26. As shown in the truth table of Table 1, the state of the memory device 100 changes in response to an external signal and an internal signal, and an operation mode corresponding to each state is executed.

The memory device 100 has four kinds of low power consumption modes: (1) a bit line floating mode, (2) a sleep mode, (3) a cell array domain PG mode, and (4) an all domain PG mode.

The PMU 105 controls the operation mode of the memory device 100 in a low power consumption state. The PMU 105 selects one operation mode from these low power consumption modes, and makes the memory device 100 execute a predetermined operation sequence.
(Bit Line Floating Mode)

In the standby mode, the bit line pair (BL and BLB) is boosted to the precharge voltage (Vpr1). In the bit line floating mode, the bit line pair (BL and BLB) is brought into a floating state. Data in the memory cell 20 are not lost.
(Sleep Mode)

In the standby state, the voltage VDM is applied to the power domain 162. In the sleep mode, the voltage VDML lower than the voltage VDM is applied to the power domain 162. The voltage VDML is a voltage at which data in the memory cell 20 are not lost. The bit line pair (BL and BLB) is brought into a floating state.
(Cell Array Domain PG Mode)

Application of the voltage VDM to the power domain 162 is stopped. The bit line pair (BL and BLB) is brought into a floating state. Data in the memory cell 20 are lost.
(All Domain PG Mode)

In the all domain PG mode, all the domains where power gating can be performed is subjected to power gating. Application of the voltages VDD and VDH to the power domain 161 is stopped, and application of the voltage VDM to the power domain 162 is stopped. Data in the memory cell 20 are lost.

The four low power consumption modes have different break-even times (BET) at which the effect of reducing power consumption is obtained, and BET_blfl<BET_slp<BET_pgca<BET_pgall. The BET_blfl, the BET_slp, the BET_pgca, and the BET_pgall are BETs of the bit line floating mode, the sleep mode, the cell array domain PG mode, and the all domain PG mode, respectively. With the plurality of low power consumption modes having different BETs, the power consumption of the memory device 100 can be reduced efficiently.

The backup operation of backing up the data in the memory cell 20 to the backup circuit 30 is required for the shift from the standby state SS3 to the cell array domain PG state SS13, and the recovery operation of data to the memory cell 20 is necessary for the return from the cell array domain PG state SS13 to the standby state SS3. The same applies to the all domain PG state SS14. Thus, the BET_pgca and the BET_pgall are long. When a long time (e.g., several hundred milliseconds) idle state is generated, the effect of reducing power consumption can be obtained by the all domain PG mode.

In the bit line floating mode, data in the memory cell 20 are not lost. The transition between the standby state SS3 and the bit line floating state SS11 does not require backup and recovery operation. Thus, time and energy overhead for the transition between the standby state SS3 and the bit line floating state SS11 is small. The same applies to the sleep mode.

In the sleep mode, the power supply voltage of the cell array 110 decreases from VDM to VDML, whereby the standby power of the memory device 100 can be reduced. The standby power is power consumption due to leakage current of a transistor. The subthreshold current that is a main factor of the leakage current of the transistor decreases exponentially when the power supply voltage becomes smaller than or equal to a certain value. Therefore, the sleep mode contributes very effectively to reduction of the standby power of the cell array 110. For example, under the condition that VSS is 0 V, VDM is 1.2 V, and VDML is 0.6 V (=VDM/2), the leakage current in the sleep mode becomes approximately 20% to 30% of the leakage current in the standby mode in some cases. The BET_slp changes depending on VDML; for example, VDML can be set to an intermediate value between the BET_blfl and the BET_pgca.

The difference between the BET_blfl and the BET_pgca is large in many cases. The provision of the sleep mode can fill the difference, and a more appropriate low power consumption mode can be selected in accordance with an idle time. For example, in the case where the sleep mode is not provided, the BET_blfl is 10 μsec, and the BET_pgca is 10 msec, a frequent occurrence of a state in which the idle time is 6 msec makes efficient power consumption reduction difficult. By providing the sleep mode, the efficiency of power consumption reduction can be improved.

An operation sequence in the low power consumption mode of the memory device 100 is described below with reference to FIG. 5-FIG. 8. TB1, TR1, and the like denote standby time until the state of a circuit, the power supply voltage, or the like is stabilized. Although the lengths of TB1, TR1, and the like are each one clock cycle or more, some standby time may be zero clock cycles in some cases.

(Bit Line Floating Sequence and Sleep Sequence)

An example of the bit line floating sequence and the sleep sequence is described with reference to FIG. 5.

In the standby state SS3, the memory device 100 is in an idle state. For example, the precharge circuit 51 precharges all of the bit line pairs (BL and BLB) to the voltage Vpr1.

When the time for the standby state SS3 exceeds set time tk3, for example, an operation sequence for shifting from the standby mode to the bit line floating mode is executed. The set time, which is a condition for transition of the state of the memory device 100, of the time tk3 is set in accordance with the BET of each low power consumption mode, or the like.

The PMU 105 issues the signal BLFE at "H", whereby a shift from the standby state SS3 to the bit line floating state SS11 is made. With the input of the signal BLFE at "H", the column circuit 124 sets all the bit line pairs (BL and BLB) to a floating state.

When there is access to the memory device 100 in the bit line floating state SS11, the PMU 105 sets the signal BLFE to "L" and the memory device 100 is returned to the standby state SS3.

When the time for the bit line floating state SS11 exceeds set time tk11, the PMU 105 issues the signal PSE2 at "L" and the signal PSE3 at "H", and brings the memory device 100 into the sleep state SS12. The power switch 152 is turned off and the power switch 153 is turned on; thus, the voltage of the V_VDM line decreases from VDM to VDML. Since the signal BLFE at "H" is continuously input to the column circuit 124, the floating state of all the bit line pairs (BL and BLB) is maintained.

When there is access to the memory device 100 in the sleep state SS12, the PMU 105 issues the signal PSE2 at "H", the signal PSE3 at "L", and the signal BLFE at "L", so that the state of the memory device 100 returns to the standby state SS3. The power switch 152 is turned on and the power switch 153 is turned off; thus, the voltage of the V_VDM line increases from VDML to VDM.

In the write state SS4 and the read state SS5, the memory device 100 performs write operation and read operation under the control of the controller 122.

(Cell Array Domain PG Sequence)

Figure 5:
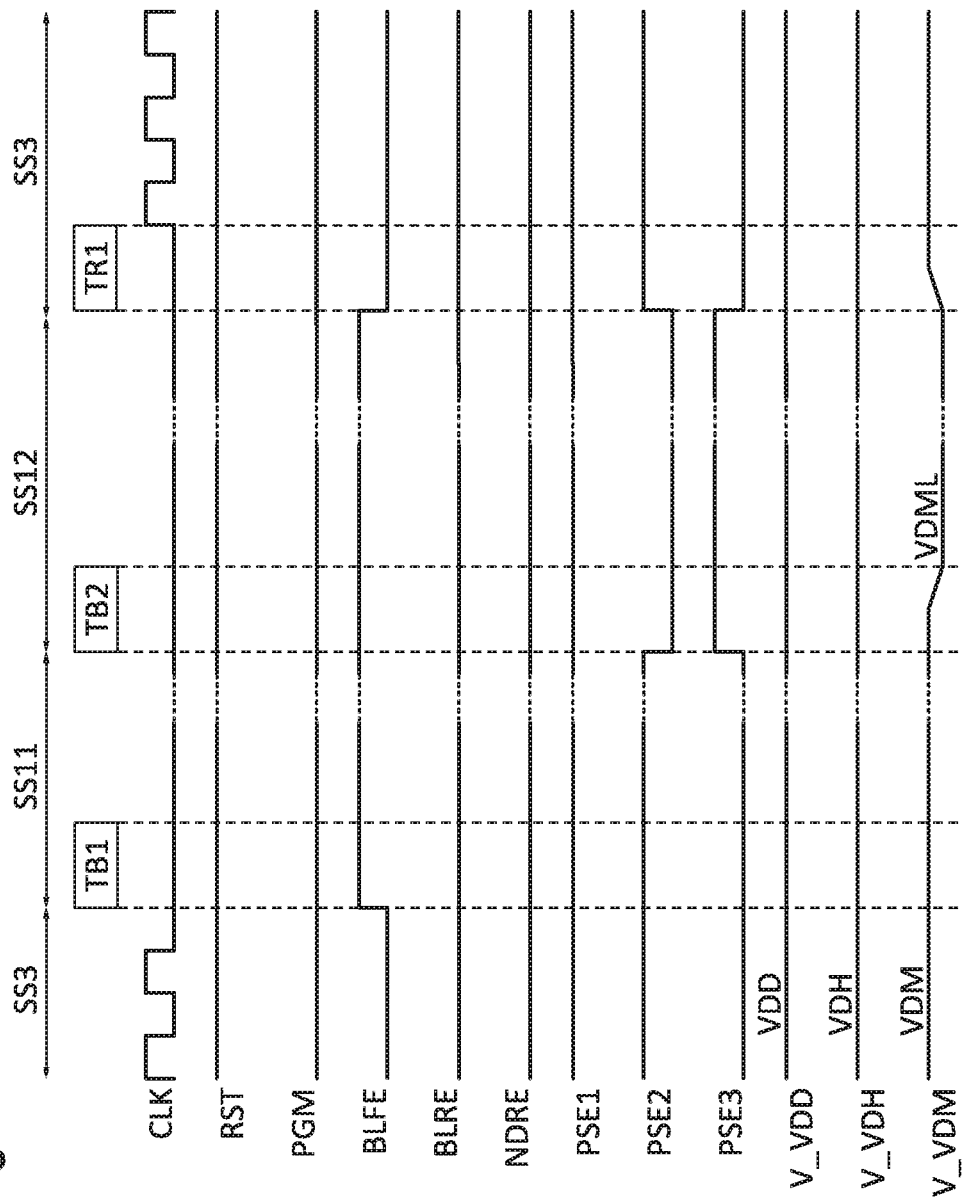
FIG. 5 A timing chart illustrating an operation sequence example of a memory device.

After time TB2 in FIG. 5, the time for the sleep state SS12 exceeds set time tk12, the operation sequence for shifting from the sleep mode to the cell array power gating mode is performed under the control of the PMU 105. An example of this operation sequence is described with reference to FIG. 6.

To obtain the cell array PG state SS13, backup operation is performed. The PMU 105 issues the signal PSE2 at "H" and the signal PSE3 at "L", so that a shift from the sleep state SS12 to the backup state SS21 is made. After the voltage of the V_VDM line is increased and becomes stable at VDM, the PMU 105 sets the signal PGM to "H". All of the wirings OGL are selected by the backup and recovery driver 125, whereby the data in the nodes Q and Qb of each of the cells 10 are written to nodes SN1 and SN2 of the backup circuit 30 (see FIG. 2A and FIG. 2B).

The PMU 105 sets the signal PSE2 to "L", whereby a shift from the backup state SS21 to the cell domain PG state SS13 is made. The power switch 152 is turned off, so that the voltage of the V_VDM line decreases to VSM. The signal PSE2 may fall at the timing when the signal PGM falls.

When there is access to the memory device 100 in the cell array domain PG state SS13, the recovery operation is executed under the control of the PMU 105 (see FIG. 2A and FIG. 2B). The PMU 105 issues the signal PGM at "H", whereby a shift from the cell array domain PG state SS13 to the recovery state SS25 is made. While the signal PGM is at "H", the PMU 105 sets the signal PSE2 to "H", so that the power switch 152 is turned on. The voltage of the V_VDM line is increased to VDM. The PMU 105 sets the signal PGM to "L", and then, sets the signal BLFE to "L", whereby a shift from the recovery state SS25 to the standby state SS3 is made.

For example, in the case where the cell array 110 includes a plurality of sub arrays, a power switch may be provided in the power domain 162 so that the application of the high level power supply voltages (VDM and VDML) can be controlled for each sub array. With such a structure, the spatial granularity of power gating of the power domain 162 can be small.

(All Domain PG Sequence)

For example, when the idle time of the memory device 100 can be predicted to exceed the BET_pgall, the operation sequence for a shift from the standby mode to the all domain PG mode is executed. An example of this operation sequence is described with reference to FIG. 7.

The PMU 105 issues the signal PGM at "H", whereby a shift from the standby state SS3 to the backup state SS22 is made. While the signal PGM is at "H", data are backed up to the backup circuit 30 in each of the cells 10 in the cell array 110. In the all domain PG mode, power gating of the cell array 110 is performed for a longer period than in the cell array domain PG mode. Thus, a period during which the signal PGM is at "H" is longer in the backup state SS22 than in the backup state SS21. That is, TB21 is longer than TB11.

When the signal RST at "L" is input, the PMU 105 sets the signals PSE1 and PSE2 to "L" to bring the memory device 100 into the all domain PG state SS14. The power switches 150-152 are turned off, the voltages of the V_VDD line and the V_VDH line are decreased to VSS, and the voltage of the V_VDM line is decreased to VSM.

The PMU 105 issues the signal PSE1 at "H", whereby a shift from the all domain PG state SS14 to the recovery state SS26 is made. The power switches 150-152 are turned on, so that the voltages of the V_VDD line, the V_VDH line, the V_VDM line are increased to VDD, VDH, and VDM, respectively.

Before issuing the signal PGM at "H", the PMU 105 executes the reset operation of the nodes Q and Qb. By this reset operation, the voltages of the nodes Q and Qb are set to the voltage Vpr2.

First, the PMU 105 sets the signals BLFE and BLRE to "H" at the timing when the signal PSE1 is set to "H". The column circuit 124 performs reset operation of all the bit line pairs (BL and BLB) in response to the signals BLFE and BLRE at "H". Specifically, the precharge circuit 51 is turned off and the precharge circuit 52 is turned on. The power supply voltage of the column circuit 124 is restored, so that all the bit line pairs (BL and BLB) are precharged to the voltage Vpr2 because the transistors MN1, MN2, MP1, and MP2 in the local bit line MUX 135 are off.

With the input of the signal RST at "H", the PMU 105 sets the signal NDRE to "H". The row circuit 123 sets all the word lines WL to a selected state when the signal NDRE at "H" is input. Thus, the nodes Q and Qb are precharged to the voltage Vpr2. When the signal NDRE is set to "L", the reset operation of the nodes Q and Qb terminates.

Next, the PMU 105 outputs the signal PGM at "H". Then, the signal PSE2 is set to "H". Data held in the nodes SN1 and SN2 of the backup circuit 30 are returned to the nodes Q and Qb. The PMU 105 issues the signals BLFE and BLRE at "L", whereby a shift from the backup state SS26 to the standby state SS3 is made.

Figure 8:
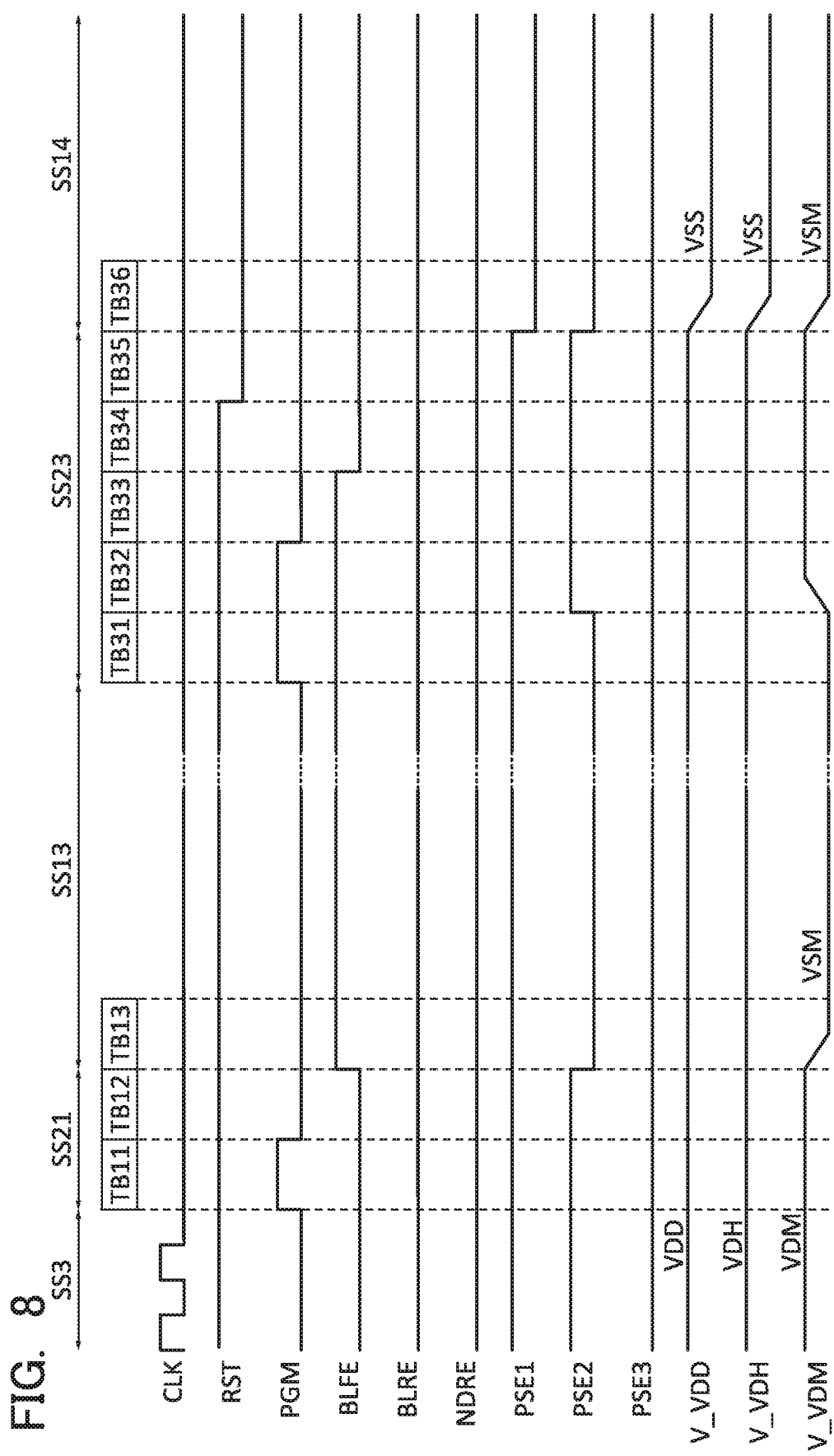
FIG. 8 A timing chart illustrating an operation sequence example of a memory device.

Next, an example of an operation sequence for a shift from the standby mode to the cell array PG mode and an example of an operation sequence for a shift from the cell array PG mode to the all domain PG mode are described with reference to FIG. 8. For example, when the idle time of the memory device 100 can be predicted to exceed the BET_pgca, the operation sequence for a shift from the standby mode to the cell array PG mode is executed.

Figure 6:
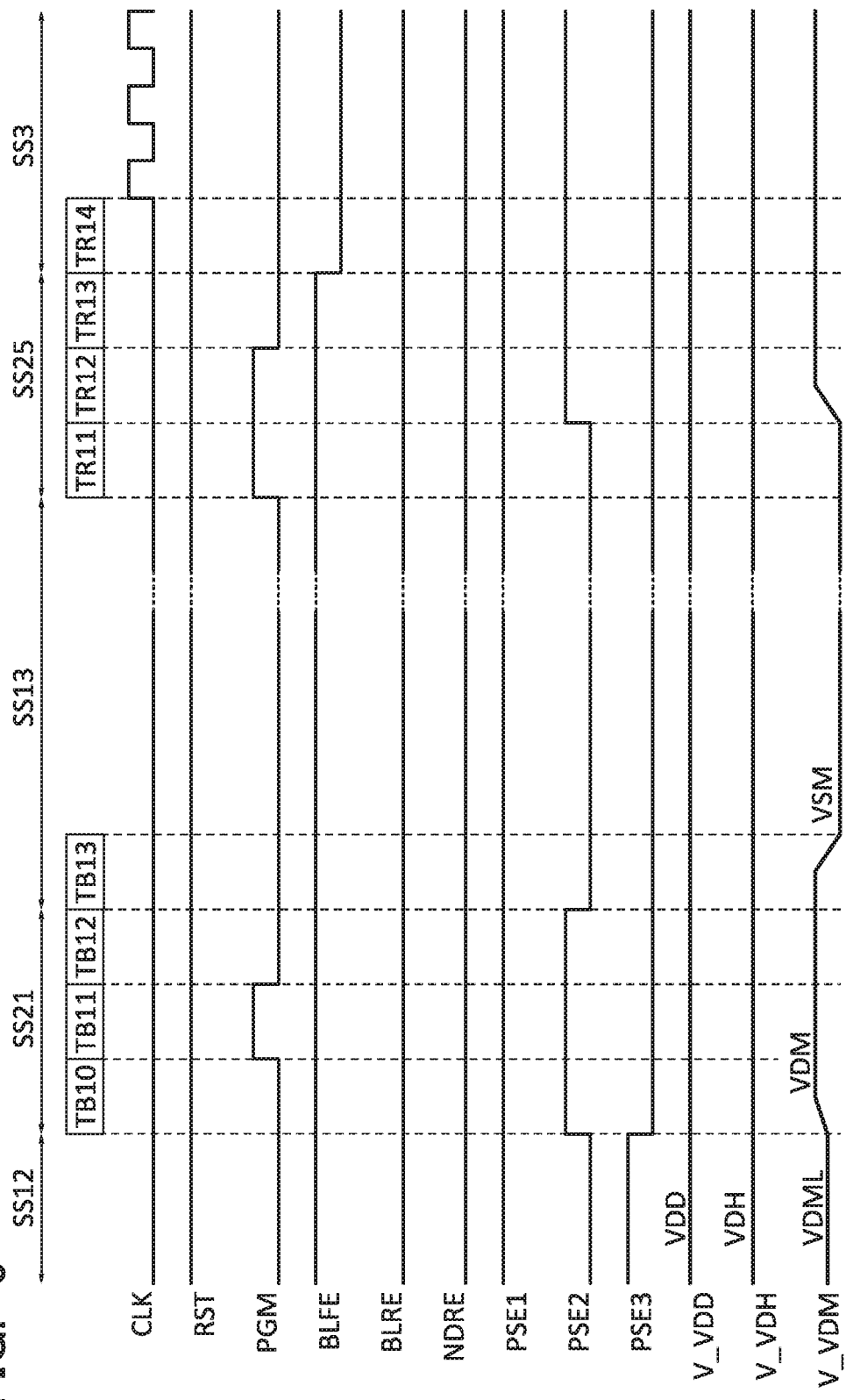
FIG. 6 A timing chart illustrating an operation sequence example of a memory device.
Figure 7:
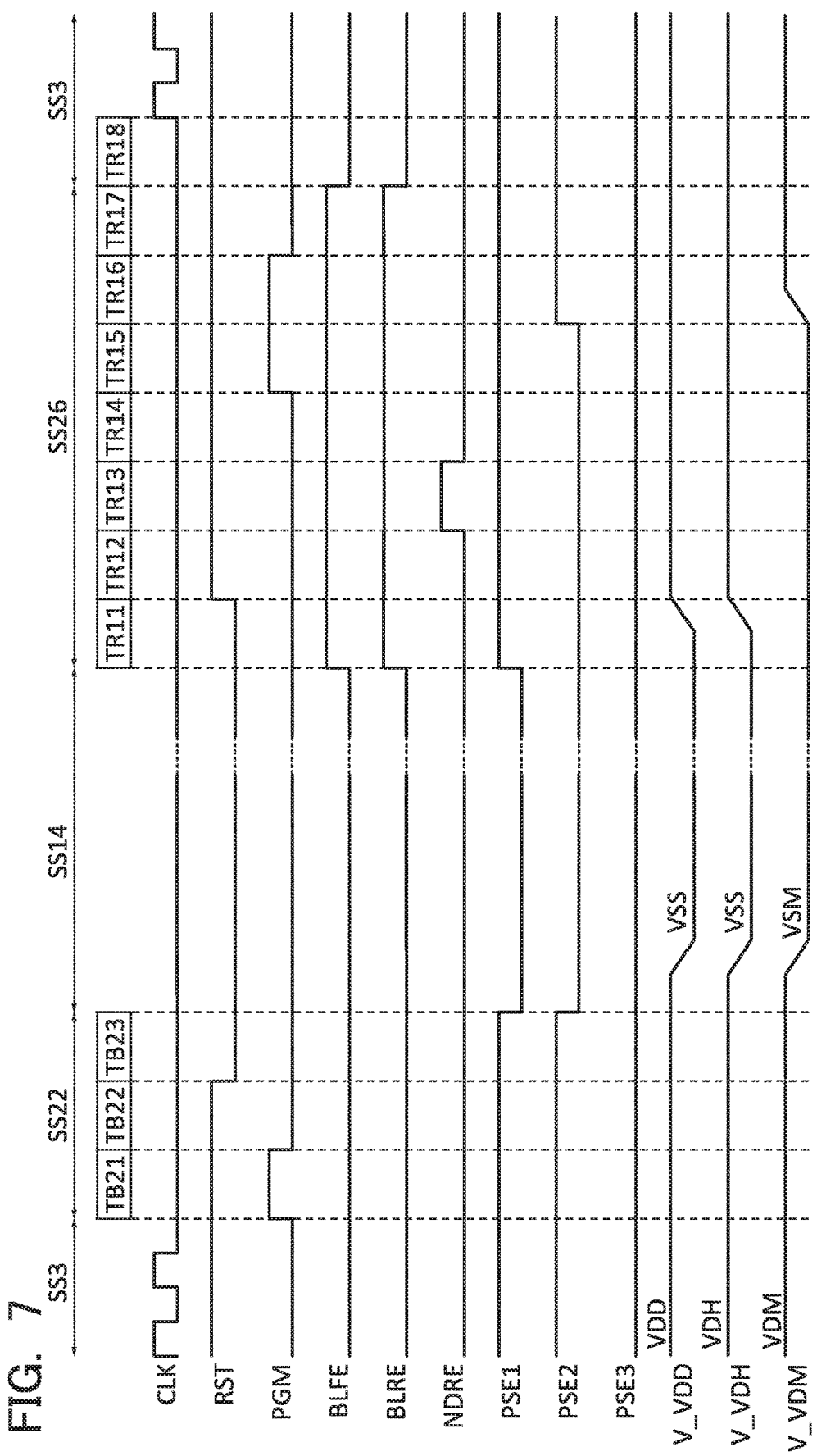
FIG. 7 A timing chart illustrating an operation sequence example of a memory device.

The PMU 105 issues the signal PGM at "H", whereby a shift from the standby state SS3 to the backup state SS21 is made. The description of FIG. 6 is referred to for the operation sequence of the backup state SS21.

When the time of the memory cell PG state SS13 exceeds the set time tk13, the PMU 105 executes an operation sequence for a shift from the cell array PG mode to the all domain PG mode.

The PMU 105 issues the signal PGM at "H", whereby a shift from the memory cell PG state SS13 to the backup state SS23 is made. By the backup and recovery driver 125, the continuity between the nodes Q and Qb of the memory cell 20 and the nodes SN1 and SN2 of the backup circuit 30 is established. Next, the PMU 105 turns on the power switch 152 by setting the signal PSE2 to "H". The voltage of the V_VDM line increases from VDML to VDM, whereby the bistable circuit 25 of the cell 10 is activated. In the backup state SS23, the bistable circuit 25 functions as a sense amplifier for detecting data in the backup circuit 30. By the bistable circuit 25, the voltage difference between the node SN1 and the node SN2 is amplified, whereby backup data are written again to the nodes SN1 and SN2.

The PMU 105 sets the signal PGM to "L" and subsequently sets the signal BLFE to "L". When the signal RST at "L" is input, the PMU 105 sets the signals PSE1 and PSE2 to "L". The state of the memory device 100 is shifted to the all domain PG state SS14.

In the all domain PG mode, power gating of the cell array 110 is performed for a longer period than in the cell array domain PG mode; thus, the period during which the signal PGM is at "H" is longer in the backup state SS23 than in the backup state S S21.

(Sleep Mode)

Figure 9:
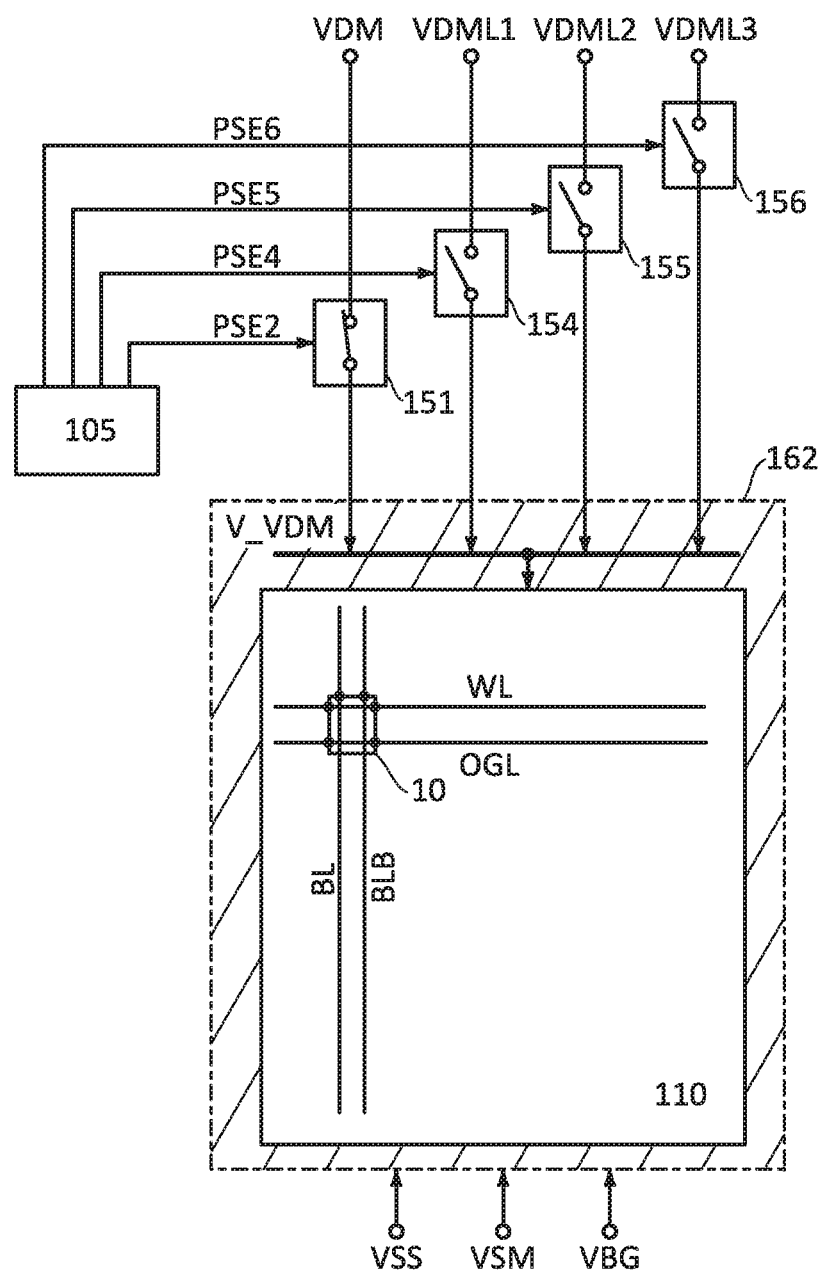
FIG. 9 A block diagram illustrating a configuration example of a memory device.

A plurality of voltages may be prepared for the sleep mode, and the input voltage to the V_VDM line may be switched in accordance with the idle time of the memory device 100. FIG. 9 illustrates such a configuration example. Voltages VDML1, VDML2, and VDML3 are voltages for the sleep mode. VDM>VDML1>VDML2>VDML3 is satisfied. The voltage VDML3 has a level at which data in the cell 10 are not lost.

Power switches 154-156 are provided to control the input of the voltages VDML1, VDML2, and VDML3 to the V_VDM line. The on/off of the power switches 154-156 is controlled by signals PSE4-PSE6. The signals PSE4-PSE6 are generated by the PMU 105. In the sleep mode, any one of the power switches 154-156 is turned on.

In the example of FIG. 9, three kinds of sleep states having different BETs are set. Basically, the lower the voltage of the V_VDM line is, the larger the BET is. As described above, the difference between the BET_blfl and the BET_pgca is large in many cases. Even in such a state, since a plurality of sleep states are prepared, more appropriate low power consumption mode can be selected in accordance with a variety of idle times; thus, the power consumption of the memory device 100 can be reduced more efficiently.

Figure 10:
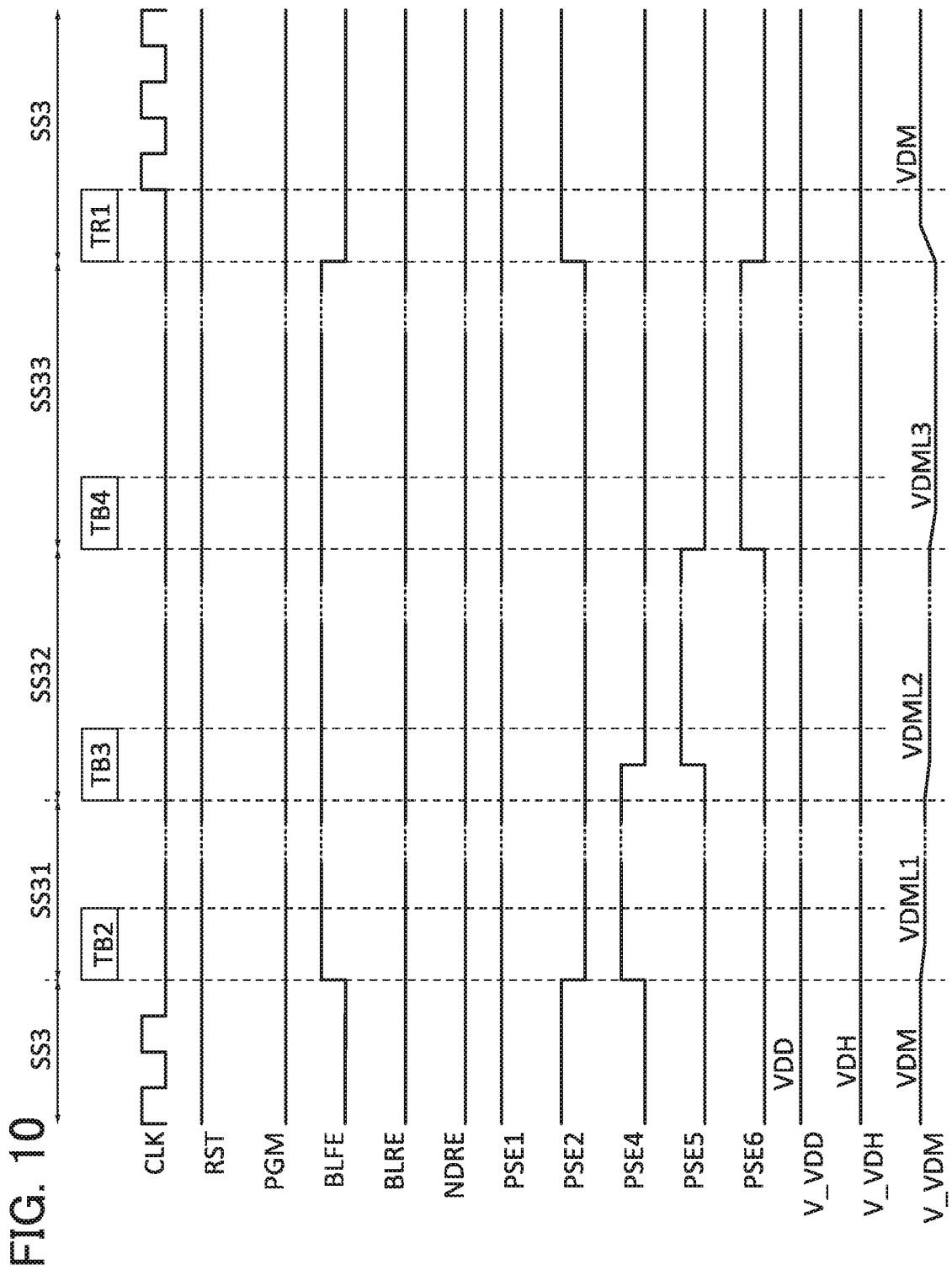
FIG. 10 A timing chart illustrating an operation sequence example of a memory device.

An example of a sleep sequence is described with reference to FIG. 10. Here, the states where the voltage of the V_VDM line is VDML1, VDML2, or VDML3 are referred to as sleep states SS31, SS32, and SS33, respectively.

The PMU 105 issues the signal PSE2 at "L" and the signal PSE4 at "H", whereby a shift from the standby state SS3 to the sleep state SS31 is made. The voltage of the V_VDM line decreases to VDML1. At the timing when the signal PSE4 becomes "H", the signal BLFE at "H" is input to the column circuit 124 and all the bit line pairs (BL and BLB) are brought into a floating state.

When the time of the sleep state SS31 exceeds set time tk31, a shift to the sleep state SS32 is made. The PMU 105 sets the signal PSE4 to "L" and sets the signal PSE5 to "H". The power switch 154 is turned off and the power switch 155 is turned on. The voltage of the V_VDM line decreases to VDML2.

When the time of the sleep state SS32 exceeds set time tk32, a shift to the sleep state SS33 is made. The PMU 105 sets the signal PSE5 to "L" and the signal PSE6 to "H". The power switch 155 is turned off and the power switch 156 is turned on. The voltage of the V_VDM line decreases to VDML3.

When there is access to the memory device 100 in the sleep state SS33, a sequence for return to the standby state SS3 is performed. The PMU 105 issues the signal PSE2 at "H", the signal PSE6 at "L", and the signal BLFE at "L". The power switch 152 is turned on and the power switch 156 is turned off; thus, the voltage of the V_VDM line increases from VDML3 to VDM. When the time of the sleep state SS33 exceeds set time tk33, a cell array PG sequence is executed.

Next, another configuration example of a memory device is described.

<<Memory Device 101>>

Figure 11:
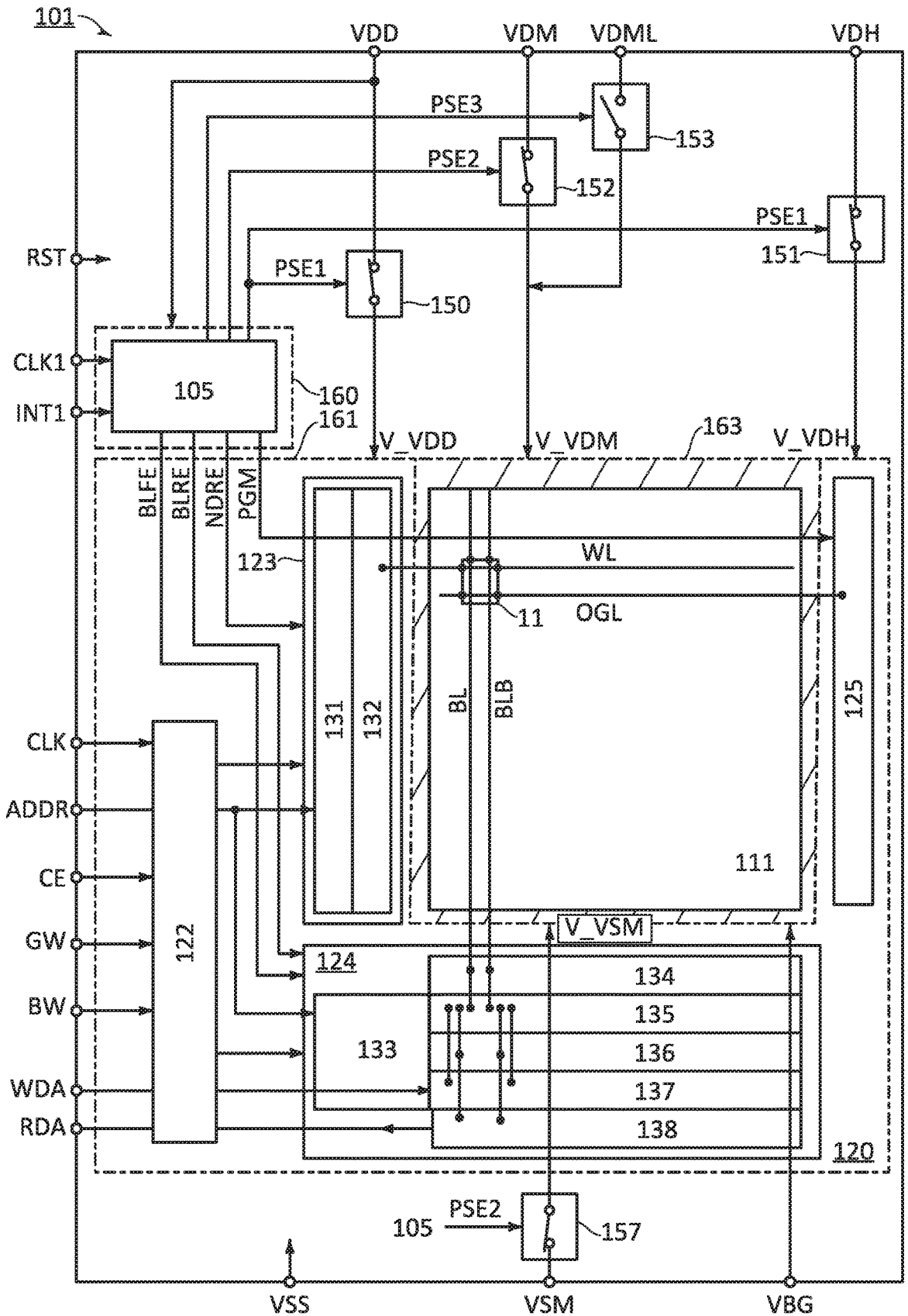
FIG. 11 A block diagram illustrating a configuration example of a memory device.

A memory device 101 illustrated in FIG. 11 is a modification example of the memory device 100. The memory device 101 operates in a manner similar to that of the memory device 100. The memory device 101 includes a power domain 163 instead of the power domain 162. A cell array 111, the V_VDM line, and a virtual power supply line V_VSM (hereinafter referred to as a V_VSM line) are provided in the power domain 163. A power switch 157 is provided in the memory device 101. The on/off of the power switch 157 is controlled by the signal PSE2. The voltage VSM is input to the V_VSM line through the power switch 157.

Figure 12A:
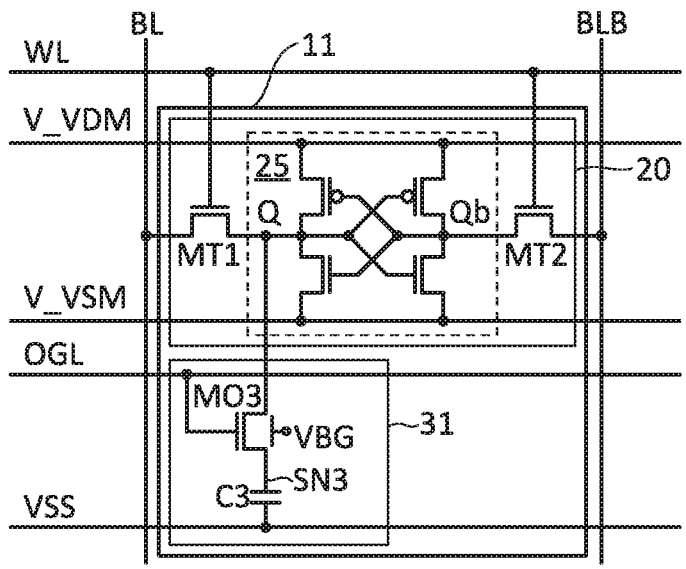
FIG. 12 A: A circuit diagram illustrating a configuration example of a cell. B: A timing chart showing an operation example of a memory device.

The memory cell array 111 includes a plurality of cells 11. FIG. 12A illustrates a circuit configuration example of the cell 11. The cell 11 includes the memory cell 20 and a backup circuit 31. The voltage VSM is input to the memory cell 20 through the V_VSM line.

The backup circuit 31 is composed of one 1T1C DRAM cell. The backup circuit 31 includes a node SN3, a transistor MO3, and a capacitor C3. The transistor MO3 is an OS transistor having a back gate like the transistors MO1 and MO2. The back gate of the transistor MO3 is electrically connected to the VBG line. The transistor MO3 may be an OS transistor with no back gate.

Figure 12B:
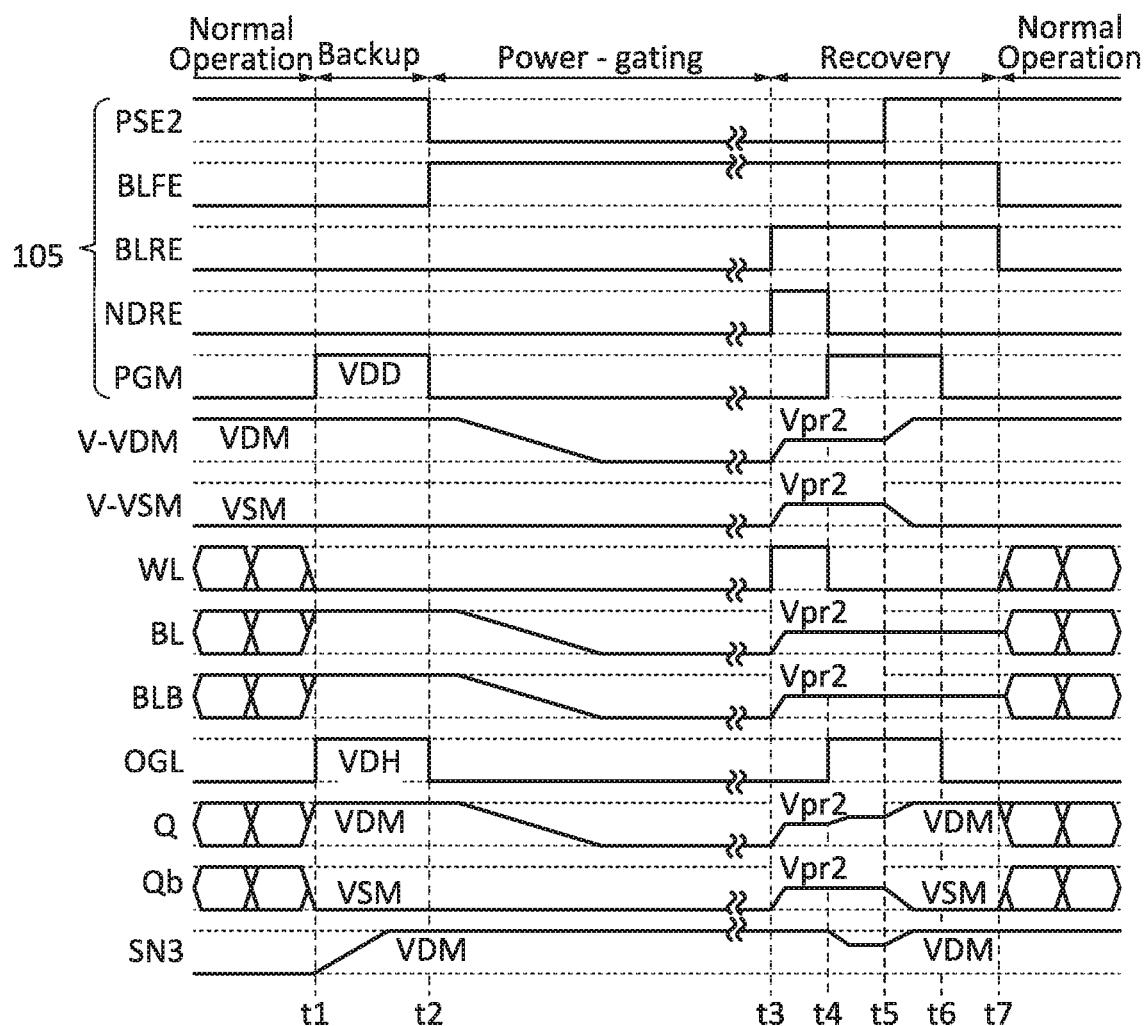

An example of a power gating sequence of the power domain 163 is described with reference to FIG. 12B. Here, a difference from the power gating sequence (FIG. 2B) of the power domain 162 is mainly described.

(Normal Operation)

Until t1, the state of the memory device 101 is a normal operation state (a write state or a read state). The memory device 101 performs normal operation similar to that of a single-port SRAM. The power switches 152 and 157 are on, the voltage VDM is input to the V_VDM line, and the voltage VSM is input to the V_VSM line.

(Backup)

When the signal PGM at "H" is input to the backup and recovery driver 125 at t1, the backup operation starts. Here, at t1, the nodes Q/Qb are at "H"/"L", and the node SN3 is at "L". Since all of the wirings OGL become "H", the transistor MO3 of the backup circuit 31 is turned on, so that the voltage of the node SN3 is raised from VSM to VDM. When the signal PGM is set to "L" at t2, the backup operation is completed. Data in the node Q are written to the node SN3 at t1.

(Power Gating)

At t2, the PMU 105 makes the signal PSE2 fall to turn off the power switches 152 and 157. To bring the bit line pairs (BL and BLB) into a floating state, the PMU 105 makes the signal BLFE rise at the timing of making the signal PSE2 fall.

(Recovery)

First, the reset operation of the nodes Q and Qb is performed. At t3, the PMU 105 sets the signals BLRE and NDRE to "H". All the bit line pairs (BL and BLB) are precharged to the voltage Vpr2 by the column circuit 124, and all the word lines WL are brought into a selected state by the row circuit 123. The V_VDM line and the V_VSM line are precharged to the voltage Vpr2, and the voltages of the nodes Q and Qb are fixed to Vpr2.

At t4, the PMU 105 sets the signal NDRE to "L" and the signal PGM to "H". The transistor MO 3 is turned on, the charge of the capacitor C3 is distributed to the node Q and the node SN3, and the voltage difference is generated between the node Q and the node Qb.

Next, the bistable circuit 25 functions as a sense amplifier and amplifies the voltage difference between the node Q and the node Qb. At t5, the power switches 152 and 157 are turned on, so that the application of the voltages VDM and VSM to the power domain 163 is resumed. When the bistable circuit 25 becomes active, the voltage difference between the node Q and the node Qb is amplified. Finally, the voltages of the nodes Q and SN3 become VDM, and the voltage of the node Qb becomes VSM. In other words, the states of the nodes Q/Qb return to the states at t1 ("H"/"L"). The PMU 105 sets the signal PGM to "L" at t6 and sets the signals BLFE and BLRE to "L" at t7. At t7, the recovery operation is completed.

The backup circuit 31 has a configuration for backup of only the node Q. Before the voltage of the wiring OGL is set to "H", the voltages of the nodes Q and Q are set to Vpr2, whereby the data in the nodes Q and Qb can be recovered with the use of the data in the node SN3 in the backup circuit 31. Thus, in the memory device 101 in the recovery states SS25 and S S26, before issuing the signal PGM at "H", the PMU 105 executes the reset operation of the nodes Q and Qb.

Figure 13A:
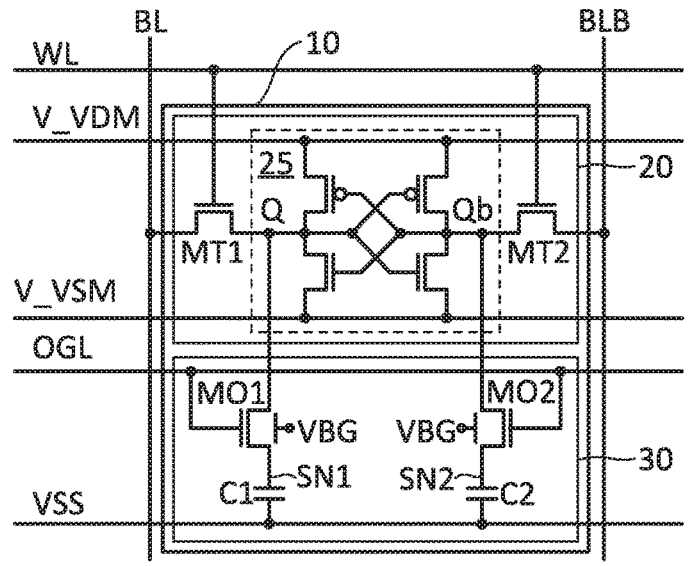
FIG. 13 A: A circuit diagram illustrating a configuration example of a cell. B: A timing chart showing an operation example of a memory device.
Figure 13B:
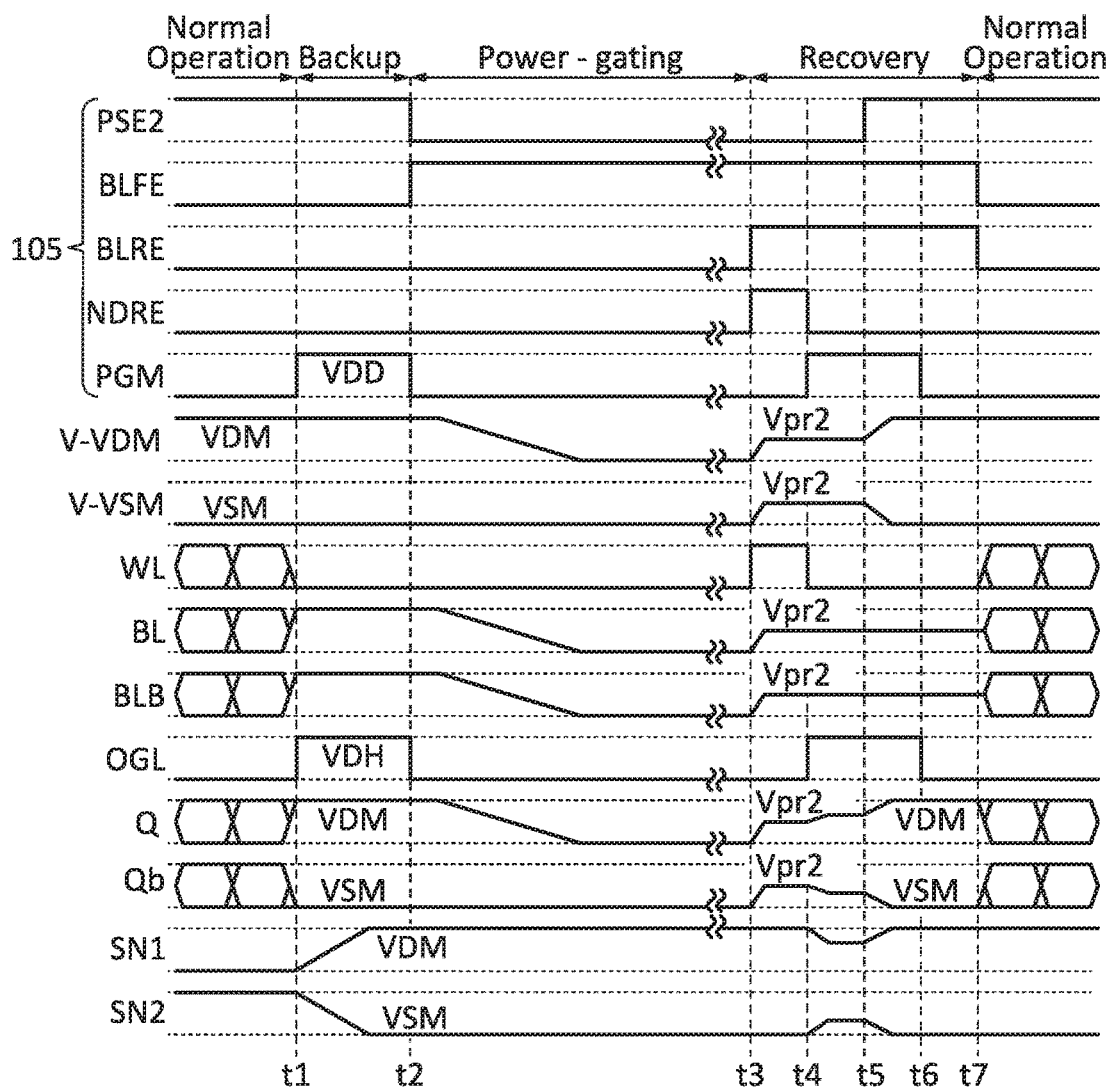

The cell array 111 can be composed of the cells 10 (FIG. 13A). In this configuration example, the power gating sequence of the power domain 163 is similar to the above described power gating sequence (see FIG. 13B). The description of FIG. 12B can be referred to for the description of FIG. 13B.

In the cell array 111, the capacitors C1 and C2 in the backup circuit 30 can be made small. This is because in the recovery operation, the nodes Q and Qb are precharged to Vpr2 and the wiring OGL is set to "H". Even when the amount of charge held in the capacitors C1 and C2 is reduced, by setting the wiring OGL to "H", the potential difference between the node Q and the node Qb can be large enough to be detected by the bistable circuit 25. By making the capacitors C1 and C2 small, the area overhead of the cell 10 due to addition of the backup circuit 30 can be reduced.

Although the backup circuit is applied to the single-port SRAM memory cell in the configuration example above, the backup circuit in this embodiment can also be applied to a multi-port SRAM memory cell. Such a circuit configuration example is shown below.

Figure 14A:
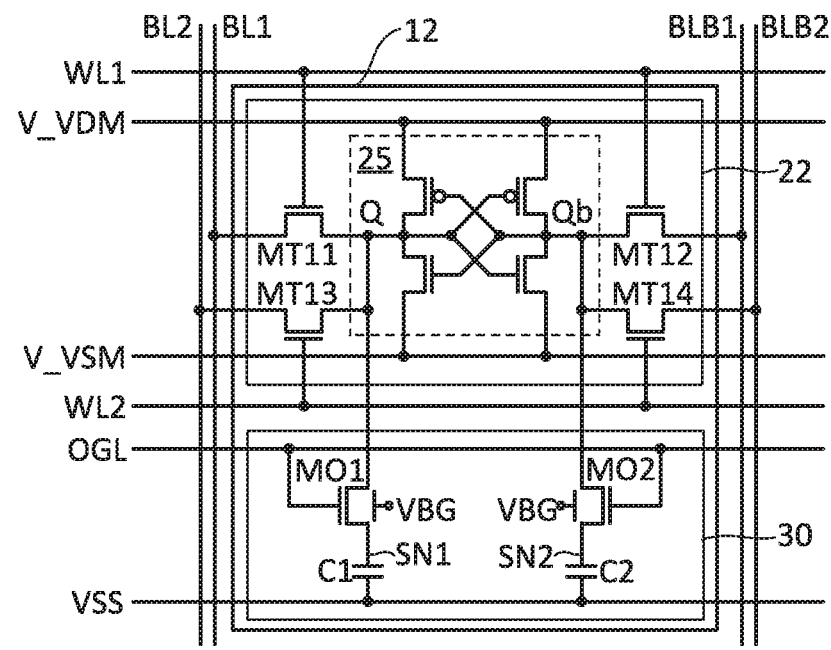
FIG. 14 A and B: Circuit diagrams illustrating configuration examples of cells.
Figure 14B:
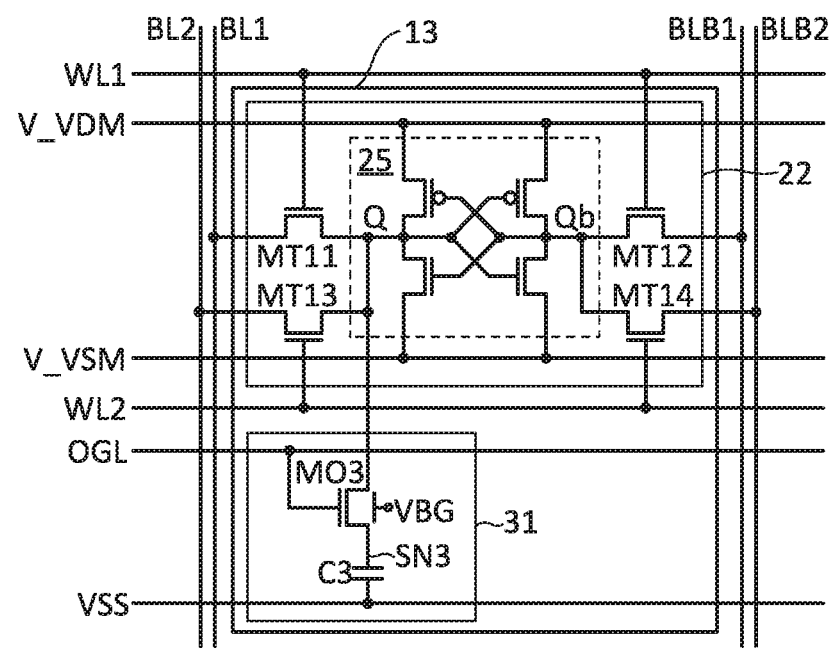

A cell 12 illustrated in FIG. 14A includes a memory cell 22 and the backup circuit 30, and a cell 13 illustrated in FIG. 14B includes the memory cell 22 and the backup circuit 31. The memory cell 22 is a multi-port SRAM memory cell, which includes the bistable circuit 25 and transistors MT11-MT14. The transistors MT11-MT14 are transfer transistors. Word lines WL1 and WL2, a bit line pair (BL1 and BLB1), a bit line pair (BL2 and BLB2), the V_VDM line, and the V_VSM line (or the VSM line) are electrically connected to the memory cell 22.

The memory device of this embodiment can be used as a memory device in any of a variety of electronic components and electronic devices. The memory device has not only two kinds of power gating modes but also a plurality of low power consumption modes with BETs shorter than those in the power gating modes; thus, the power consumption of any of electronic components and electronic devices including the memory device can be efficiently reduced.

The memory device in this embodiment typically substitutes for an SRAM. For example, the memory device in this embodiment can be incorporated in any of a variety of processors such as a microcontroller unit (MCU), an FPGA, a CPU, and a GPU as a substitute for an SRAM. In addition, the memory device in this embodiment can be incorporated in any of a variety of ICs such as a wireless IC, a display controller IC, a source driver IC, and an image decoder IC. A processor where both a processor core and a cache memory are mounted on one die is described below as an example of a processor.

<<Processor>>

Figure 15:
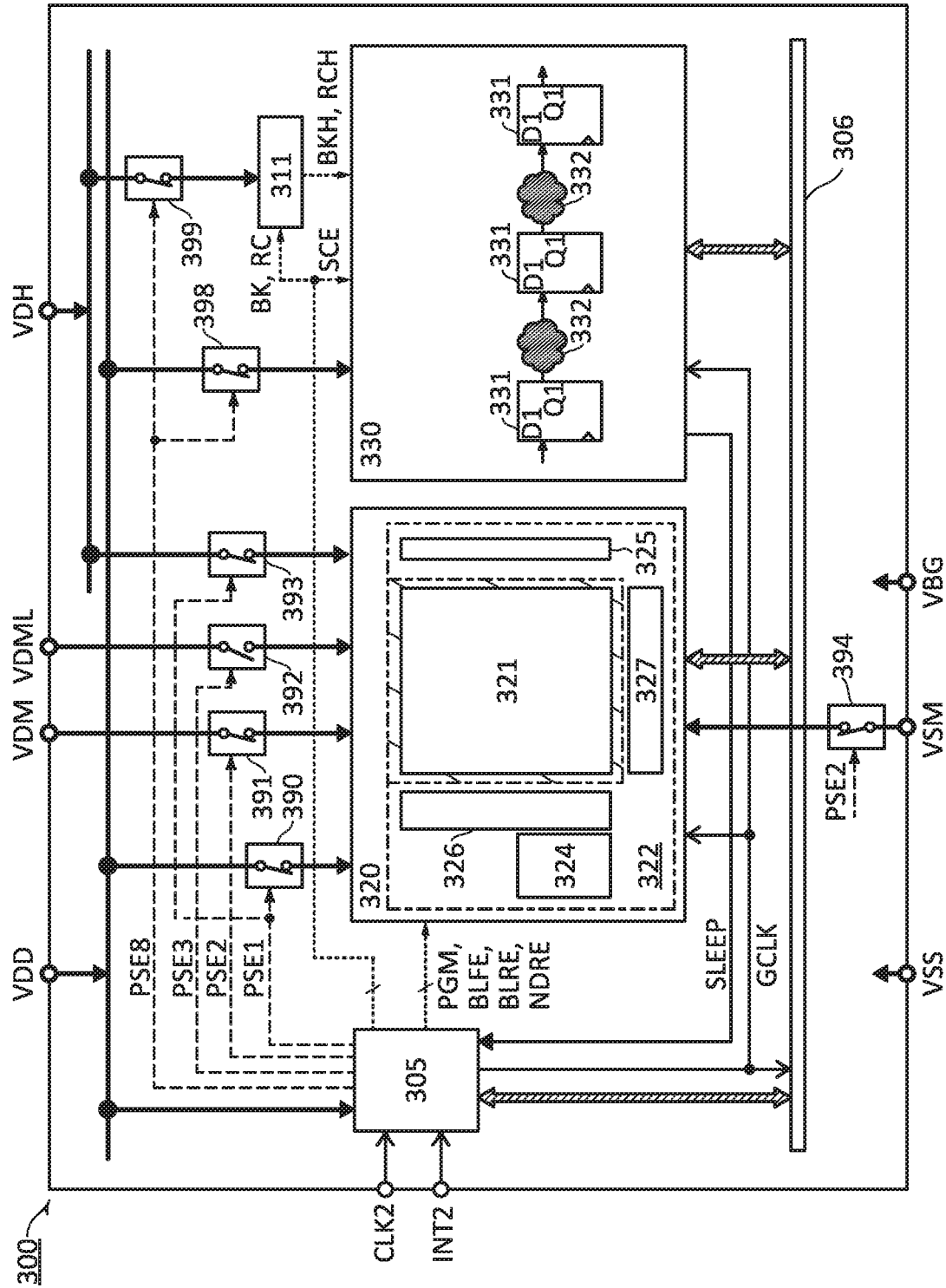
FIG. 15 A block diagram illustrating a configuration example of a CPU.

FIG. 15 is a block diagram illustrating a configuration example of a processor. A processor 300 illustrated in FIG. 15 includes a PMU 305, a bus 306, a cache memory 320, a CPU core 330, a backup and recovery driver 311, and power switches 390-394,398, and 399.

Data and signals are transmitted between the CPU core 330 and the cache memory 320 through the bus 306. The CPU core 330 includes flip-flops 331 and combinational circuits 332. The flip-flops 331 are included in registers, for example. Backup circuits are provided in the flip-flops 331, which enables power gating of the CPU core 330.

Here, the memory device 101 in FIG. 11 is used as the cache memory 320. It is needless to say that the memory device 100 can be used as the cache memory 320.

The cache memory 320 includes a cell array 321 and a peripheral circuit 322. The peripheral circuit 322 includes a controller 324, a backup and recovery driver 325, a row circuit 326, and a column circuit 327. The power switches 390-394 correspond to the power switches 150-153, and 157 in the memory device 101. The PMU 305 has the same function as the PMU 105 in the memory device 101 and generates the signals PSE1-PSE3, PGM, BLFE, BLRE, and NDRE.

The PMU 305 generates a clock signal GCLK with the use of a clock signal CLK2 input from the outside. The clock signal GCLK is input to the cache memory 320 and the CPU core 330. The PMU 305 generates signals PSE8, SCE, BK, and RC. The signals PSE8, BK, and RC are power gating control signals for the CPU core 330.

The signal PSE8 is a power switch enable signal for controlling the on/off of the power switches 398 and 399. The power switch 398 controls the application of the voltage VDD to the CPU core 330, and the power switch 399 controls the application of the voltage VDH to the backup and recovery driver 311.

The signal SCE is a scan enable signal and input to the flip-flops 331.

The backup and recovery driver 311 controls the backup circuits in the flip-flops 331 on the basis of the signals BK and RC. The signal BK is a backup signal, and the signal RC is a recovery signal. The backup and recovery driver 311 shifts the levels of the signals BK and RC to generate signals BKH and RCH. The signals BKH and RCH are input to the backup circuits in the flip-flops 331. The voltage VDH is the high-level voltage of the signals BKH and RCH.

The PMU 305 generates the clock signal GCLK and various control signals in response to an interrupt signal INT2 input from the outside and a SLEEP signal issued from the CPU core 330. For example, the SLEEP signal can be used as a trigger that brings the CPU core 330 into a power gating mode.

<<Flip-Flop 331>>

Figure 16:
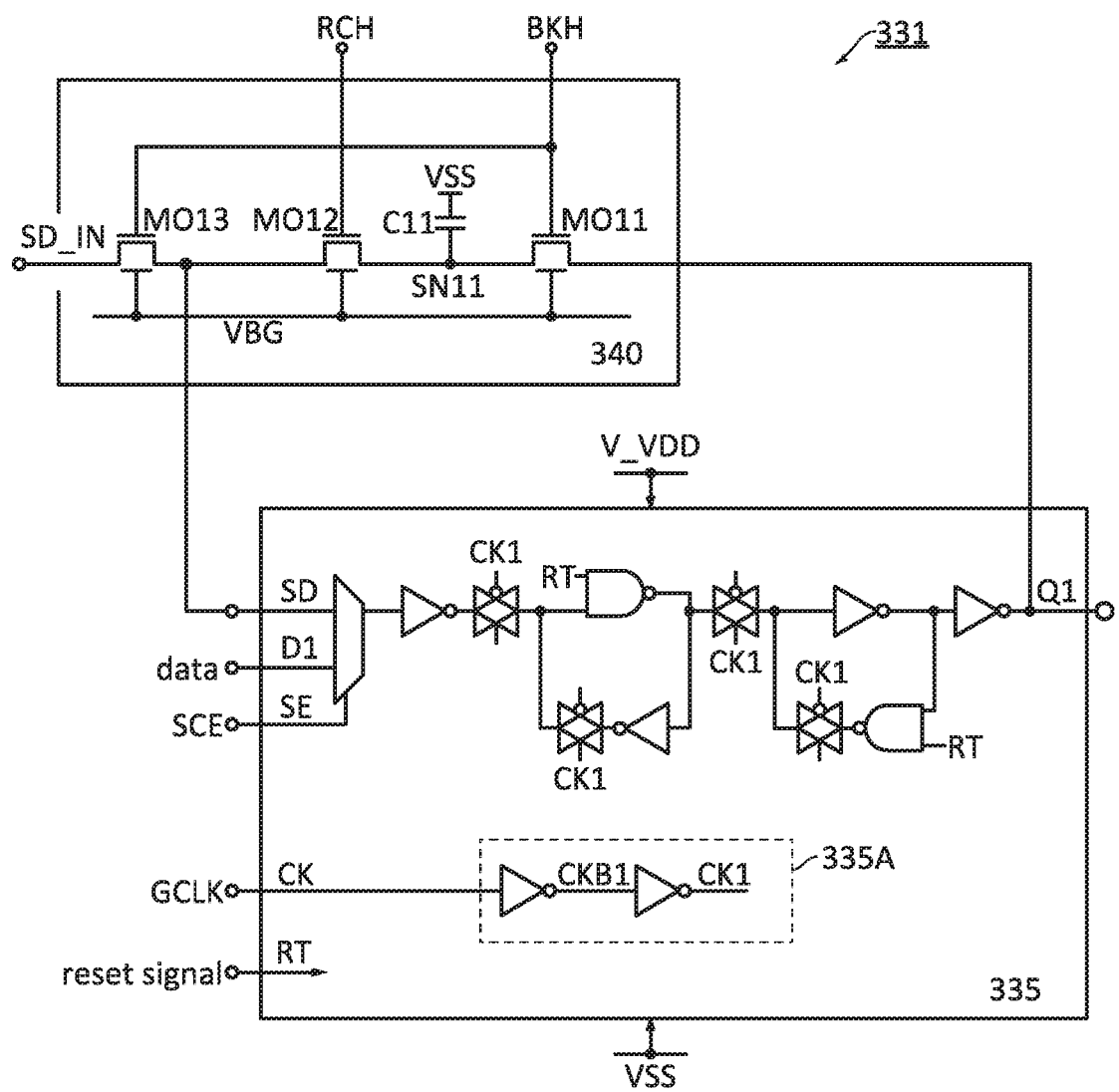
FIG. 16 A circuit diagram illustrating a configuration example of a flip-flop.

FIG. 16 illustrates a circuit configuration example of the flip-flop 331. The flip-flop 331 includes a scan flip-flop 335 and a backup circuit 340.

The voltages VDD and VSS are input to the scan flip-flop 335 through the V_VDD line and the VSS line in the CPU core 330. The scan flip-flop 335 includes nodes D1, Q1, SD, SE, RT, and CK and a clock buffer circuit 335A.

The node D1 is a data input node, the node Q1 is a data output node, and the node SD is a scan test data input node. The node SE is a signal SCE input node. The node CK is a clock signal GCLK input node. The clock signal GCLK is input to the clock buffer circuit 335A. Respective analog switches in the scan flip-flop 335 are electrically connected to nodes CK1 and CKB1 of the clock buffer circuit 335A. The node RT is a reset signal input node.

The circuit configuration of the scan flip-flop 335 is not limited to that in FIG. 16. A scan flip-flop prepared in a standard circuit library can be applied.

<Backup Circuit 340>

The backup circuit 340 includes nodes SD_IN and SN11, transistors MO11-MO13, and a capacitor C11.

The node SD_IN is a scan test data input node and is electrically connected to the node Q1 of another scan flip-flop 335. The node SN11 is a retention node of the backup circuit 340. The capacitor C11 is electrically connected to the VSS line and the node SN11.

The transistor MO11 controls continuity between the node Q1 and the node SN11. The transistor MO12 controls continuity between the node SN11 and the node SD. The transistor MO13 controls continuity between the node SD_IN and the node SD. The on/off of the transistors MO11 and MO13 is controlled by the signal BKH, and the on/off of the transistor MO12 is controlled by the signal RCH.

The transistors MO11-MO13 are OS transistors each including a back gate, like the transistor MO1. The back gates of the transistors MO11-MO13 are electrically connected to the VBG line in the CPU core 330. At least the transistors MO11 and MO12 are preferably OS transistors. Because of the feature of the OS transistor, i.e., an extremely low off-state current, a decrease in the voltage of the node SN11 can be suppressed and almost no power is consumed to retain data; therefore, the backup circuit 340 is capable of retaining data for a long time, i.e., it has a nonvolatile characteristic. Hence, while the CPU core 330 is in a power-gating state, data can be held in the backup circuit 340.

<<Low Power Consumption Mode of CPU Core 330>>

The CPU core 330 can be set to a clock gating mode or a power gating mode as a low power consumption mode. The PMU 305 selects the low power consumption mode of the CPU core 330 on the basis of the signal INT2 and the SLEEP signal. The PMU 305 stops generation of the signal GCLK, whereby the CPU core 330 can be brought into a clock gating state.

Figure 17:
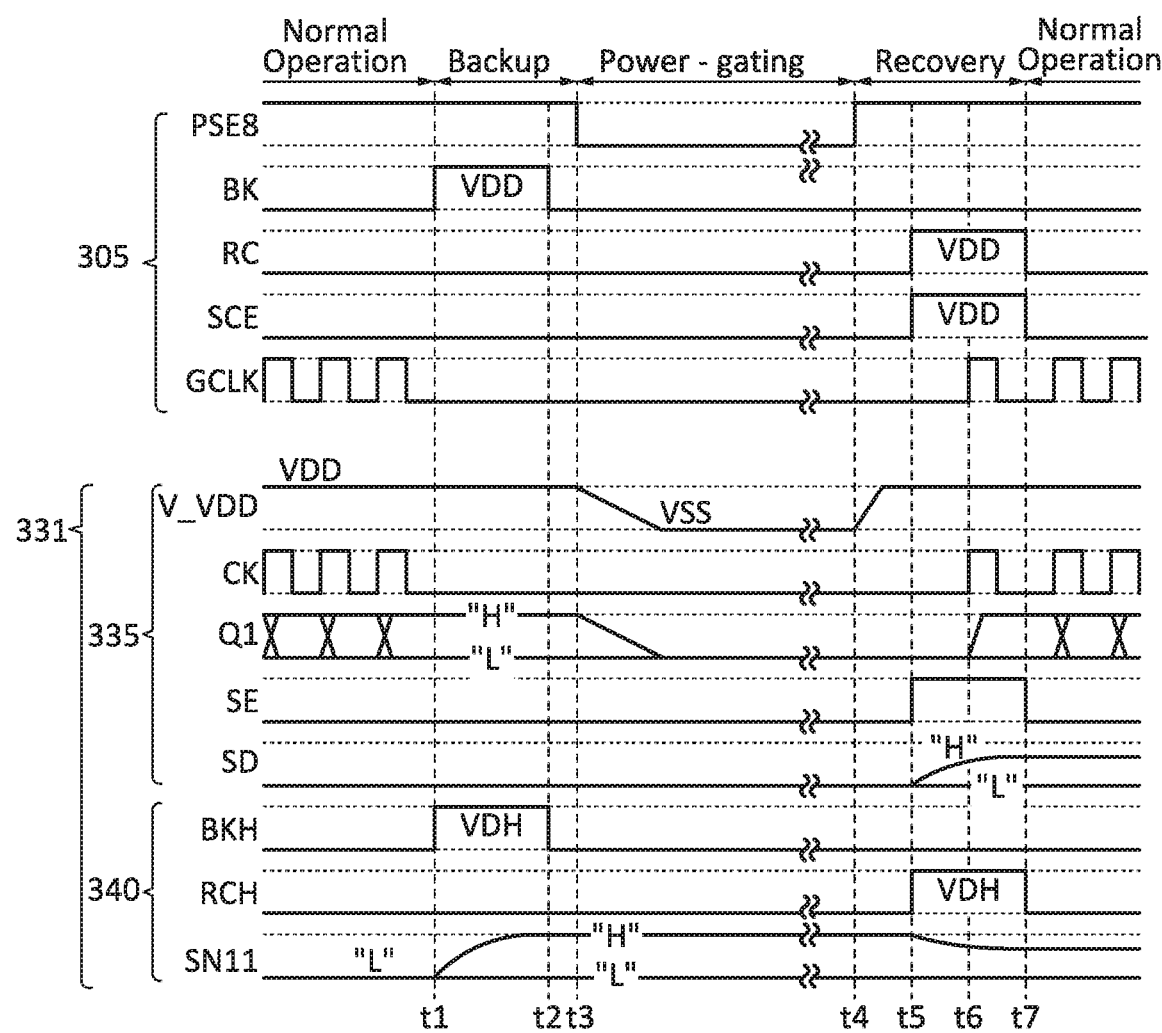
FIG. 17 A timing chart showing an operation example of a flip-flop.

When the CPU core 330 is brought into a power gating state from a normal operation state, data in the flip-flop 331 are backed up to the backup circuit 340. When the CPU core 330 is returned from a power gating state to a normal operation state, recovery operation writing back data in the backup circuit 340 to the flip-flop 331 is performed. An example of the power gating sequence of the CPU core 330 is described below with reference to FIG. 17.

(Normal Operation)

Until t1, the flip-flop 331 performs normal operation. The PMU 305 outputs the signals SCE, BK, and RC at "L". Here, at t1, the node SN11 of the backup circuit 340 is at "L". The node SE is at "L"; thus, the scan flip-flop 335 stores data in the node D1.

(Backup)

At t1, the PMU 305 stops the clock signal GCLK and sets the signal BK to "H". The transistor MO11 is turned on, and data in the node Q1 of the scan flip-flop 335 are written to the node SN11 of the backup circuit 340. When the node Q1 of the scan flip-flop 335 is at "L", the node SN11 remains at "L", whereas when the node Q1 is at "H", the node SN11 becomes "H".

The PMU 305 sets the signal BK to "L" at t2 and sets the signal PSE8 to "L" at t3. The state of the CPU core 330 is shifted to a power gating state at t3. At the timing when the signal BK falls, the signal PSE8 may fall.

(Power Gating)

When the signal PSE8 is set to "L, the power switches 398 and 399 are turned off. The voltage of the V_VDD line decreases, so that data in the node Q1 are lost. The node SN11 retains data that are stored in the node Q1 at t1.

(Recovery)

When the PMU 305 sets the signal PSE8 to "H" at t4, the power gating state is shifted to a recovery state. Charging of the V_VDD line begins. When the voltage of the V_VDD line becomes VDD (at t5), the PMU 305 sets the signals RC and SCE to "H".

The signal RCH is set to "H"; thus, the transistor MO12 is turned on, and a charge in the capacitor C11 is distributed to the node SN11 and the node SD. When the node SN11 is at "H", the voltage of the node SD increases. The node SE is at "H", and thus, data in the node SD are written to a latch circuit on the input side of the scan flip-flop 335. When the clock signal GCLK is input to the node CK at t6, data in the latch circuit on the input side are written to the node Q1. In other words, data in the node SN11 are written to the node Q1.

When the PMU 305 sets the signals SCE and RC to "L" at t7, the recovery state terminates.

In the processor of this embodiment, the processor core and the memory device are each provided with the backup circuit; thus, the power consumption of the whole processor can be efficiently reduced.

Embodiment 2

In this embodiment, an IC chip, an electronic component, electronic devices, and the like are described as examples of a semiconductor device.

<<Example of Method for Manufacturing Electronic Component>>

The electronic component is also referred to as a semiconductor package or an IC package.

Figure 18A:
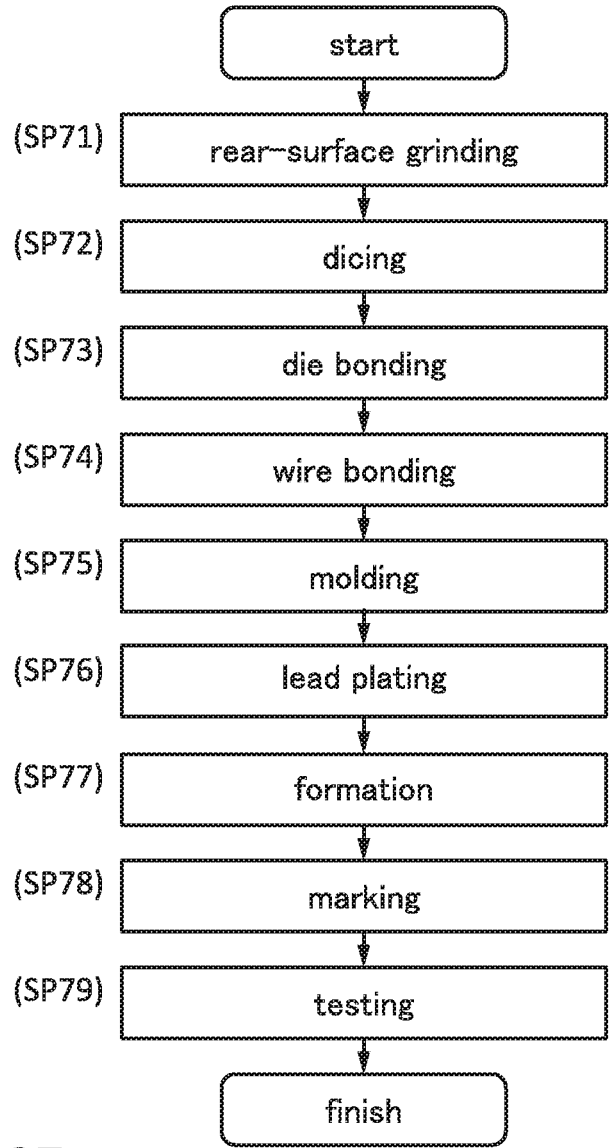
FIG. 18 A: A flow chart illustrating an example of a method for manufacturing an electronic component. B: A schematic perspective view illustrating a structure example of an electronic component.

The electronic component is completed through a pre-process and an assembly process (a post-process). In the pre-process, a semiconductor device of one embodiment of the present invention and the like are manufactured on a semiconductor wafer (e.g., a silicon wafer). Hereinafter, the post-process is described with reference to FIG. 18A.

In the post-process, first, a "rear-surface grinding step" of grinding a rear surface of the semiconductor wafer (a surface on which a semiconductor device and the like are not formed) is performed (Step SP71). This grinding aims to reduce the size of the electronic component by thinning the semiconductor wafer. After Step SP71, a "dicing step" of separating the semiconductor wafer into a plurality of chips is performed (Step SP72). In the dicing step, the semiconductor wafer is cut along dicing lines, so that chips are cut out from the semiconductor wafer.

A "die bonding step" in which the separated chips are separately picked out and bonded on a lead frame is performed (Step SP73). In the die bonding step, the chip may be bonded to the lead frame by an appropriate method depending on a product, for example, with resin or tape. The chip may be bonded to an interposer substrate instead of the lead frame.

Next, a "wire bonding step" of electrically connecting a lead of the lead frame and an electrode on the chip with a metal fine line (wire) is performed (Step SP74). A silver line, a gold line, or the like can be used as the metal fine line. For wire bonding, ball bonding or wedge bonding can be employed, for example. A wire-bonded chip 7110 is subjected to a "molding step" of sealing with epoxy resin or the like (Step SP75).

The lead of the lead frame is plated in a "lead plating step" (Step SP76). The lead is cut and processed in a "formation step" (Step SP77). Printing (marking) is performed on a surface of the package in a "marking step" (Step SP78). After an inspection step (Step SP79) for checking the quality of an external shape, the presence of a malfunction, and the like, the electronic component is completed.

Figure 18B:
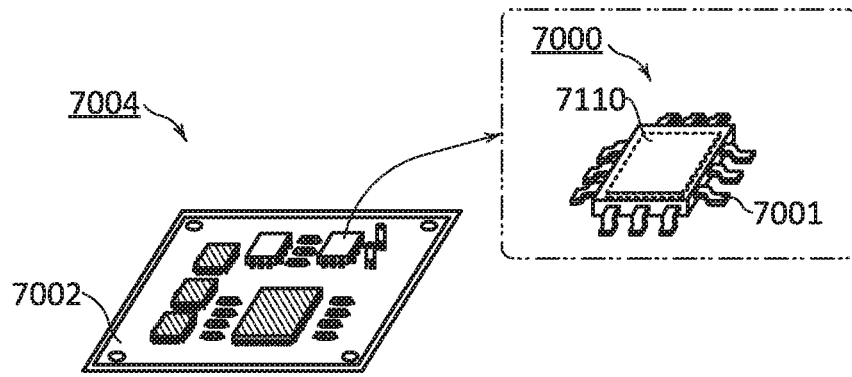

FIG. 18B is a schematic perspective view of the completed electronic component. The electronic component has a plurality of standards and names depending on a terminal extraction direction and a terminal shape. FIG. 18B illustrates a quad flat package (QFP) as an example of the electronic component.

An electronic component 7000 in FIG. 18B includes a lead 7001 and the chip 7110. The chip 7110 includes the memory device in Embodiment 1 or a processor including the memory device.

The electronic component 7000 may include a plurality of chips 7110. The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 includes a low-power memory device; thus, implementation of the electronic component 7000 in an electronic device can reduce the power consumption of the electronic device. Next, electronic devices each including the electronic component are described.

Figure 19A:
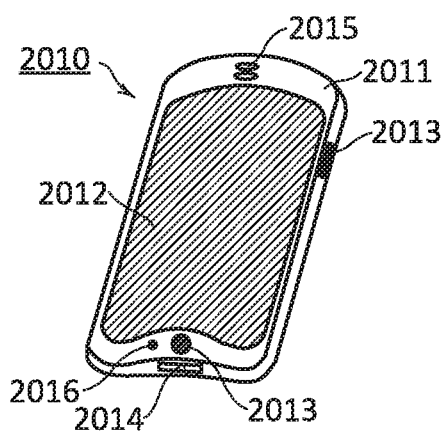
FIG. 19 A-F: Diagrams illustrating structure examples of electronic devices.

An information terminal 2010 illustrated in FIG. 19A includes, in addition to a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting text, and screen switching of the display portion 2012 can be performed by touching the display portion 2012 with a finger or the like. The information terminal 2010 can also be operated by inputting sound from the microphone 2016. Various operations such as power on/off operation and screen switching of the display portion 2012 can be performed by operating the operation button 2013.

Figure 19B:
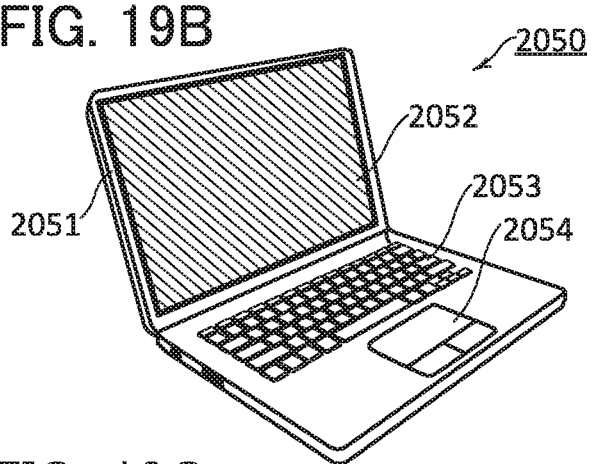

A laptop PC (personal computer) 2050 illustrated in FIG. 19B includes a housing 2051, a display portion 2052, a keyboard 2053, and a pointing device 2054. The laptop PC 2050 can be operated by touch operation on the display portion 2052.

Figure 19C:
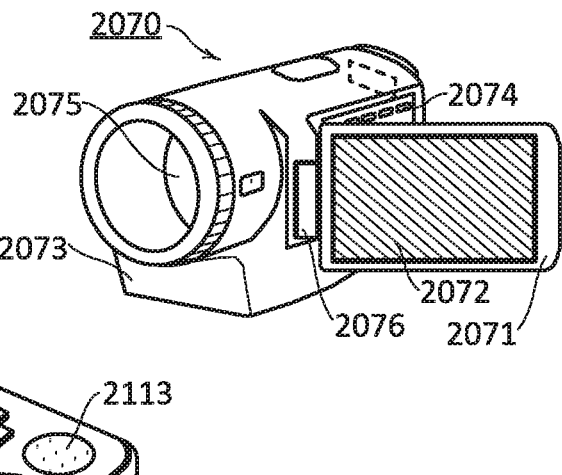

A video camera 2070 illustrated in FIG. 19C includes a housing 2071, a display portion 2072, a housing 2073, an operation key 2074, a lens 2075, and a joint 2076. The display portion 2072 is provided in the housing 2071, and the operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be changed in accordance with the angle between the housing 2071 and the housing 2073 at the joint 2076. Various operations such as starting or stopping video recording, magnification and zoom adjustment, and changing a shooting range can be performed by touch operation on the display portion 2072.

Figure 19D:
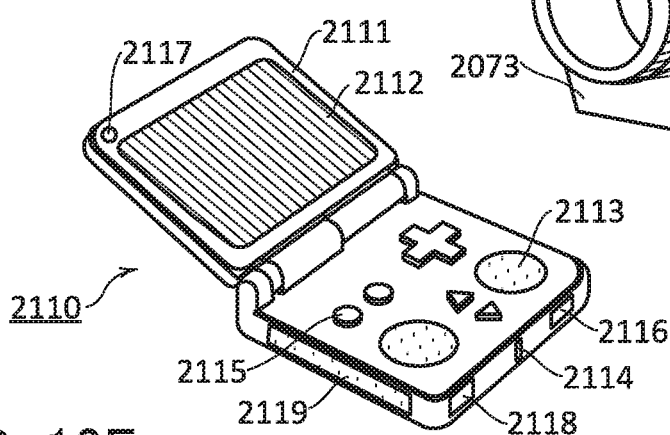

A portable game machine 2110 illustrated in FIG. 19D includes a housing 2111, a display portion 2112, speakers 2113, an LED lamp 2114, operation buttons 2115, a connection terminal 2116, a camera 2117, a microphone 2118, and a recording medium read portion 2119.

Figure 19E:
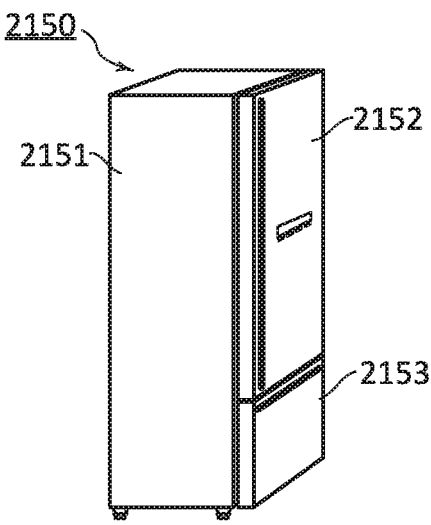

An electric refrigerator-freezer 2150 illustrated in FIG. 19E includes a housing 2151, a refrigerator door 2152, a freezer door 2153, and the like.

Figure 19F:
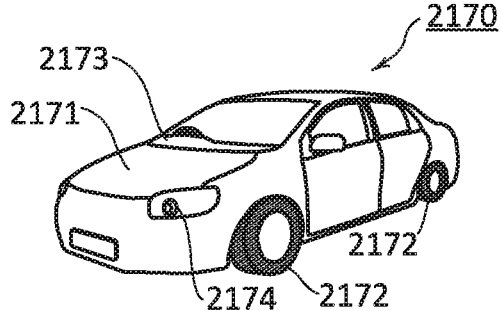

A motor vehicle 2170 illustrated in FIG. 19F includes a car body 2171, wheels 2172, a dashboard 2173, lights 2174, and the like.

Embodiment 3

In this embodiment, a semiconductor device composed of a Si transistor and an OS transistor is described. A structure of such a semiconductor device is described here using the memory device 100 in Embodiment 1 as an example.

<<Stacked Structure of Memory Device 100>>

Figure 20:
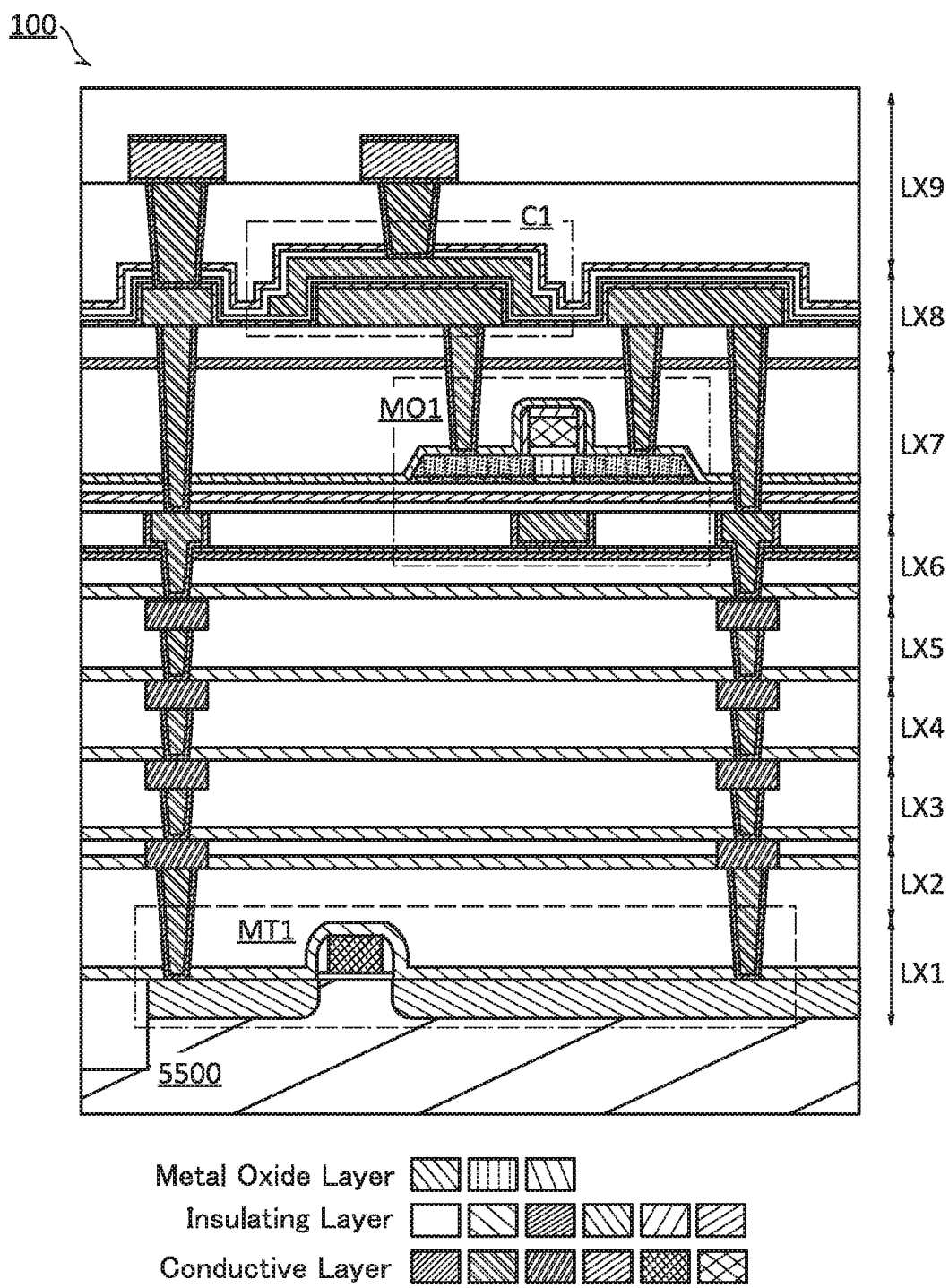
FIG. 20 A cross-sectional view illustrating an example of a stacked-layer structure of a memory device.

A structure of the memory device 100 is described with reference to FIG. 20. In FIG. 20, typically, the transistors MT1 and MO1 and the capacitor C1 are illustrated. The memory device 100 includes a single crystal silicon wafer 5500 and a stacked layer of layers LX1-LX9. Wirings, electrodes, plugs, and the like are provided in the layers LX1-LX9. Note that FIG. 20 is a cross-sectional view for describing an example of the stacked-layer structure of the memory device 100, and is not a cross-sectional view of the memory device 100 taken along a specific section line.

In the layer LX1, a Si transistor included in the memory device 100, such as the transistor MT1, is provided. A channel formation region of the Si transistor is provided in the single crystal silicon wafer 5500.

An OS transistor such as the transistor MO1, MO2, or the like is provided in the layer LX7. A back gate electrode of the OS transistor is provided in the layer LX6. Here, the OS transistor has a structure similar to an OS transistor 5004 to be described later (see FIG. 22B). The layer LX9 includes the capacitor C1. The capacitor C1 can be provided below the layer LX7.

Next, structure examples of the OS transistor are described with reference to FIGS. 21A-FIG. 22B. On the left side of FIG. 21A-FIG. 22B, cross-sectional structures of the OS transistors in the channel length direction are illustrated, and on the right side, cross-sectional structures of the OS transistors in the channel width direction are illustrated.

<<OS Transistor Structural Example 1>>

Figure 21A:
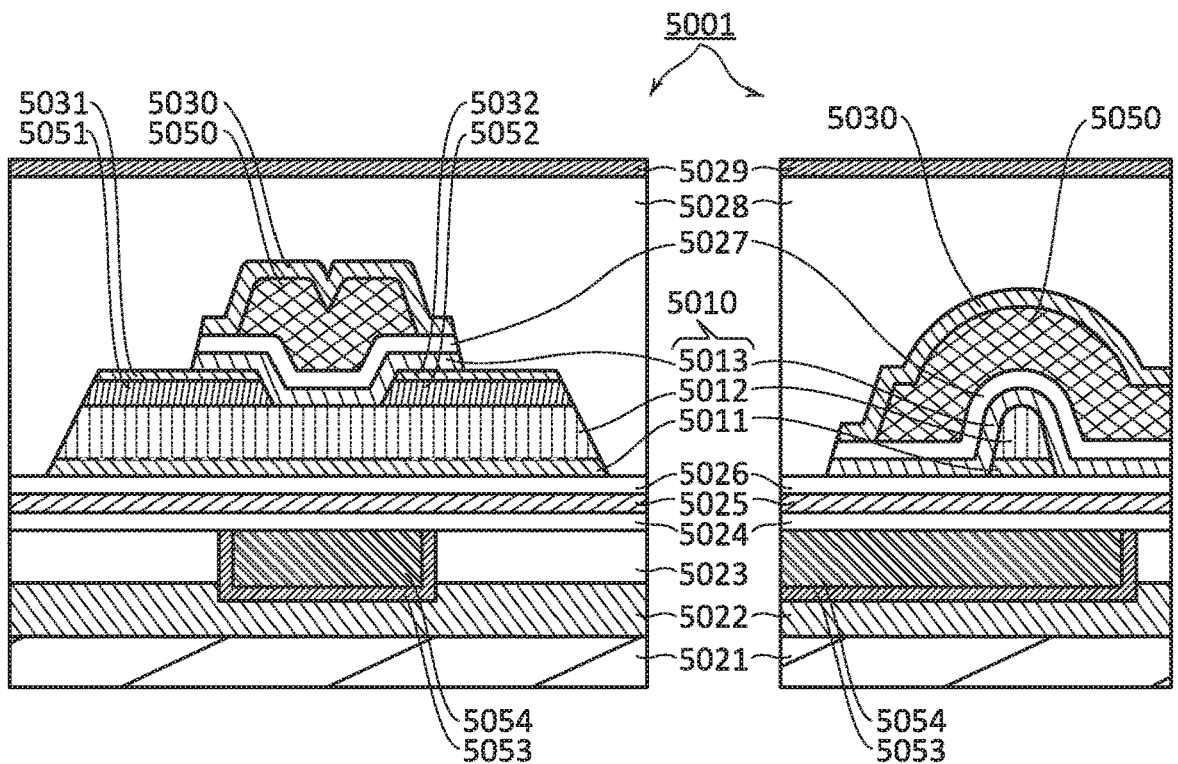
FIG. 21 A and B: Cross-sectional views illustrating structure examples of OS transistors.

An OS transistor 5001 illustrated in FIG. 21A is formed over an insulating surface. Here, the OS transistor 5001 is formed over an insulating layer 5021.

The OS transistor 5001 is covered with insulating layers 5028 and 5029. The OS transistor 5001 includes insulating layers 5022-5027 and 5030-5032, metal oxide layers 5011-5013, and conductive layers 5050-5054.

An insulating layer, a metal oxide layer, a conductive layer, and the like in the drawings may have a single-layer structure or a stacked structure. These can be formed by any of a variety of deposition methods such as a sputtering method, a molecular beam epitaxy method (MBE method), a pulsed laser ablation method (PLA method), a chemical vapor deposition method (CVD method), and an atomic layer deposition method (ALD method). Examples of the CVD method include a plasma CVD method, a thermal CVD method, and a metal organic CVD method.

The metal oxide layers 5011-5013 are collectively referred to as an oxide layer 5010. As illustrated in FIG. 21, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is formed using the conductive layer 5050, and a pair of electrodes that functions as a source electrode and a drain electrode of the OS transistor 5001 is formed using the conductive layers 5051 and 5052. The conductive layers 5050-5052 are covered with the insulating layers 5030-5032, respectively, that function as barrier layers. A back gate electrode is formed using a stack of the conductive layer 5053 and the conductive layer 5054. The OS transistor 5001 does not necessarily include a back gate electrode. The same applies to an OS transistor 5002 to be described later.

Agate insulating layer on a gate (front gate) side is formed using the insulating layer 5027, and a gate insulating layer on a back gate side is formed using a stack of the insulating layers 5024-5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 interposed therebetween.

Examples of a conductive material used for the conductive layers 5050-5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing the above metal as its component (tantalum nitride, titanium nitride, molybdenum nitride, or tungsten nitride). Furthermore, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or a single layer of tungsten. Alternatively, in the case where the conductive layer 5050 has a two-layer structure or a three-layer structure, the following combinations can be used: (aluminum and titanium); (titanium nitride and titanium); (titanium nitride and tungsten); (tantalum nitride and tungsten); (tungsten nitride and tungsten); (titanium, aluminum, and titanium); (titanium nitride, aluminum, and titanium); and (titanium nitride, aluminum, and titanium nitride). The conductor described first is provided on the insulating layer 5027 side.

The conductive layer 5051 and the conductive layer 5052 have the same layer structure. For example, in the case where the conductive layer 5051 is a single layer, metals such as aluminum, titanium, chromium, nickel, copper, yttrium, zirconium, molybdenum, silver, tantalum, and tungsten, or an alloy containing any of these metals as its main component may be used. In the case where the conductive layer 5051 has a two-layer structure or a three-layer structure, the following combinations can be used: (titanium and aluminum), (tungsten and aluminum), (tungsten and copper), (a copper-magnesium-aluminum alloy and copper), (titanium and copper), (titanium or titanium nitride, aluminum or copper, and titanium or titanium nitride), (molybdenum or molybdenum nitride, aluminum or copper, and molybdenum or molybdenum nitride). The conductor described first is provided on the insulating layer 5027 side.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., a tungsten layer). With such a structure, a stack of the conductive layer 5053 and the conductive layer 5054 functions as a wiring and has a function of suppressing diffusion of hydrogen into the oxide layer 5010.

Examples of insulating materials used for the insulating layers 5021-5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021-5032 are formed using a single layer or a stacked layers of these insulating materials. The layers forming the insulating layers 5021-5032 may include a plurality of insulating materials.

In this specification and the like, an oxynitride refers to a compound that contains more oxygen than nitrogen, and a nitride oxide refers to a compound that contains more nitrogen than oxygen.

In the OS transistor 5001, the oxide layer 5010 is preferably surrounded by an insulating layer with oxygen and hydrogen barrier properties (hereinafter a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 functions as a barrier layer and at least one of the insulating layers 5021, 5022, and 5024 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. A barrier layer may be further provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents oxidation of the conductive layer 5050. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

A structure example of the insulating layers 5021-5032 is described. In this example, each of the insulating layers 5021,5022,5025,5029, and 5030-5032 functions as a barrier layer. The insulating layers 5026-5028 are oxide layers containing excess oxygen. The insulating layer 5021 is silicon nitride, the insulating layer 5022 is aluminum oxide, and the insulating layer 5023 is silicon oxynitride. The gate insulating layers (5024-5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 and 5030-5032 are formed using aluminum oxide.

FIG. 21 illustrates an example in which the oxide layer 5010 has a three-layer structure; however, one embodiment of the present invention is not limited thereto. For example, the oxide layer 5010 can have a two-layer structure without the metal oxide layer 5011 or the metal oxide layer 5013 or may be composed of one of the metal oxide layers 5011-5012. Alternatively, the oxide layer 5010 may be composed of four or more metal oxide layers.

<<Structure Example 2 of OS Transistor>>

Figure 21B:
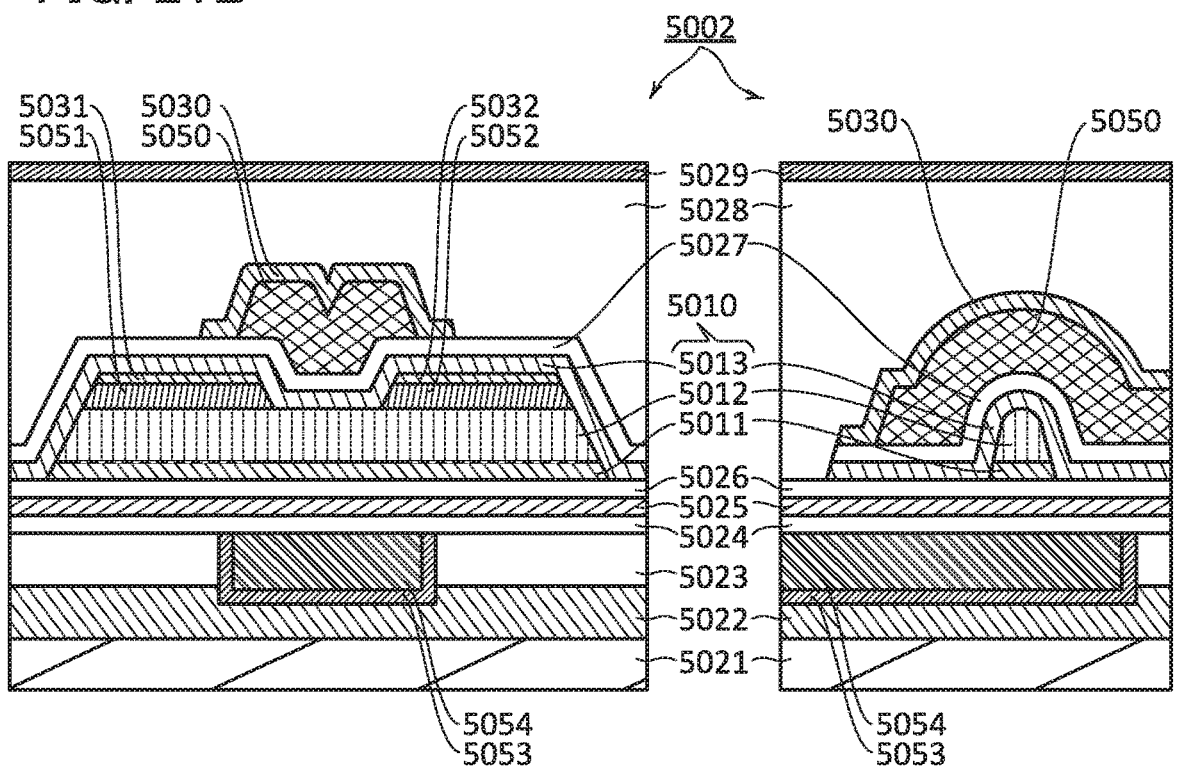

The OS transistor 5002 illustrated in FIG. 21B is a modification example of the OS transistor 5001. In the OS transistor 5002, top and side surfaces of a stack of the metal oxide layers 5011 and 5012 are covered with a stack of the metal oxide layer 5013 and the insulating layer 5027. Thus, the OS transistor 5002 does not necessarily include the insulating layers 5031 and 5032.

<<Structure Example 3 of OS Transistor>>

Figure 22A:
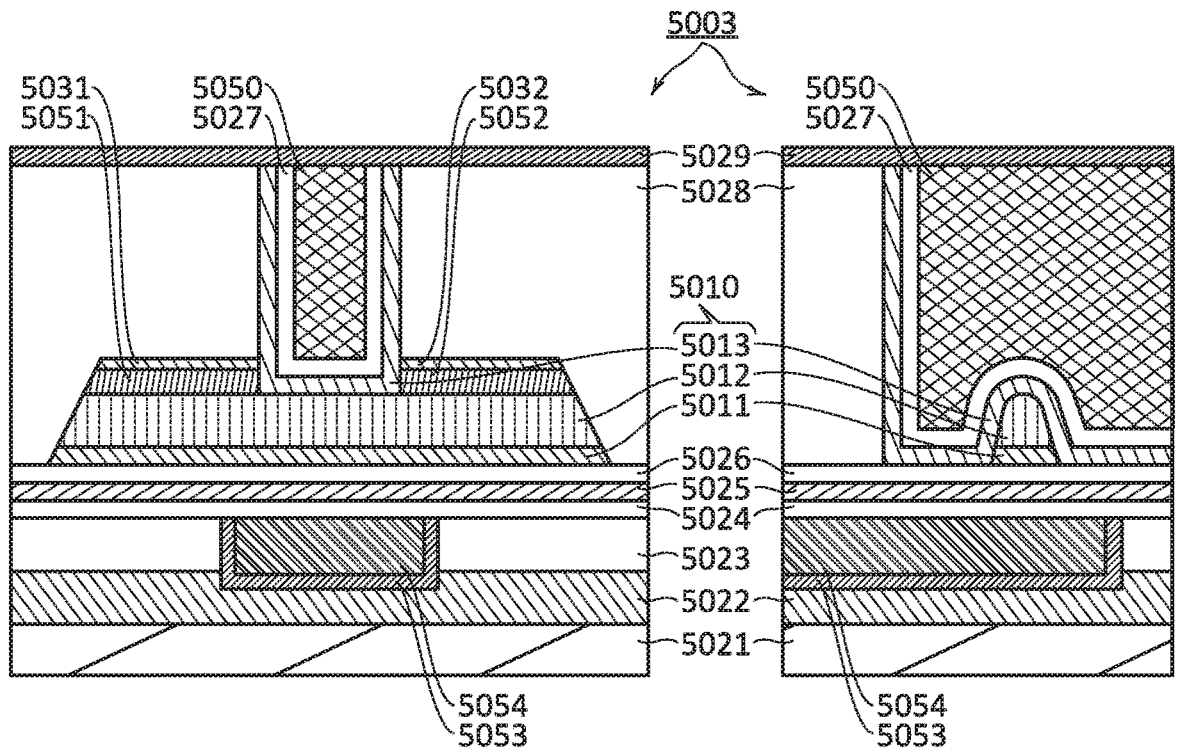
FIG. 22 A and B: Cross-sectional views illustrating structure examples of OS transistors.

An OS transistor 5003 in FIG. 22A is a modification example of the OS transistor 5001, and differs from the OS transistor 5001 mainly in the structure of the gate electrode.

The metal oxide layer 5013, the insulating layer 5027, and the conductive layer 5050 are provided in an opening portion formed in the insulating layer 5028. In other words, a gate electrode is formed in a self-aligning manner by using the opening portion of the insulating layer 5028. Thus, in the OS transistor 5003, a gate electrode (5050) does not include a region that overlaps with a source electrode or a drain electrode (5051 or 5052) with a gate insulating layer (5027) interposed therebetween. Accordingly, gate-source parasitic capacitance and gate-drain parasitic capacitance can be reduced and frequency characteristics can be improved. Furthermore, the gate electrode width can be controlled by the opening of the insulating layer 5028; thus, it is easy to manufacture an OS transistor with short channel length.

<<Structure Example 4 of OS Transistor>>

Figure 22B:
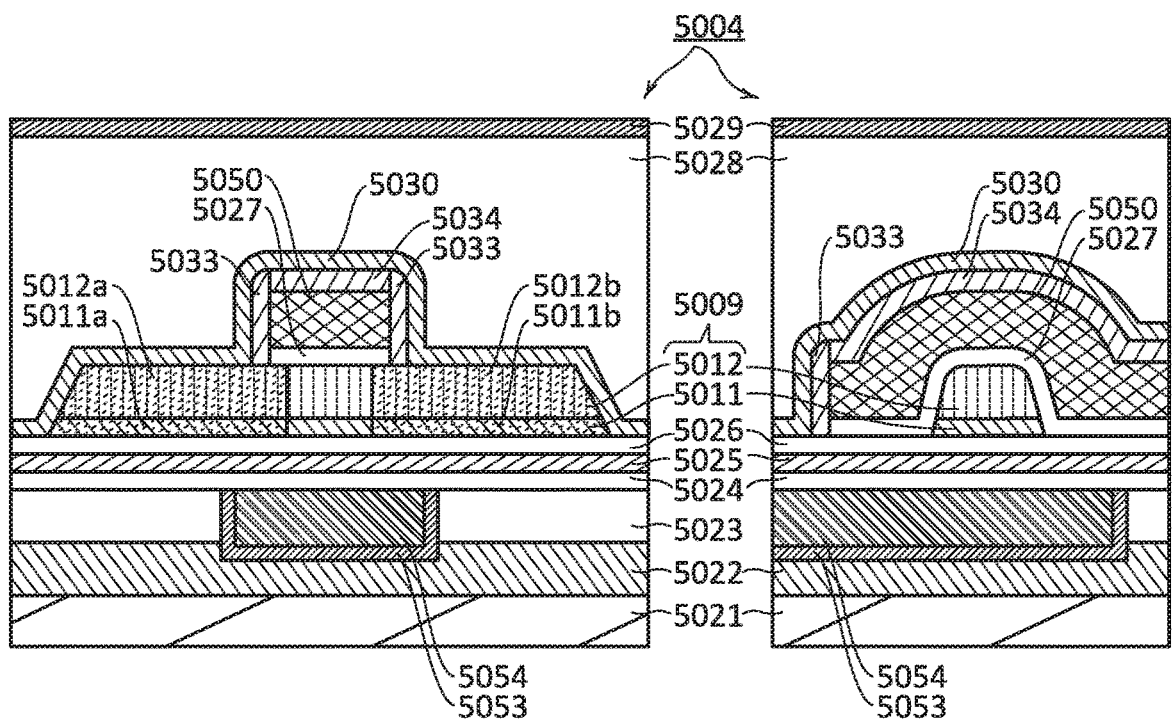

The OS transistor 5004 in FIG. 22B is different from the OS transistor 5001 in the structures of the gate electrode and the oxide layer.

The gate electrode (5050) of the OS transistor 5004 is covered with insulating layers 5033 and 5034. The OS transistor 5004 includes an oxide layer 5009 composed of the metal oxide layers 5011 and 5012. Instead of the conductive layers 5051 and 5052, low-resistance regions 5011a and 5011b are provided in the metal oxide layer 5011, and low-resistance regions 5012a and 5012b are provided in the metal oxide layer 5012. By selectively adding impurity elements (e.g., hydrogen or nitrogen) to the oxide layer 5009, the low-resistance regions 5011a, 5011b, 5012a, and 5012b can be formed.

Adding impurity elements to the metal oxide layer causes formation of oxygen vacancies in the regions to which the impurity elements are added, and the impurity elements enter the oxygen vacancies. This increases the carrier density and thus decreases the resistance of the added regions.

A channel formation region of the OS transistor is preferably a CAC-OS (cloud-aligned composite metal oxide semiconductor).

The CAC-OS has a conducting function in a part of a material and has an insulating function in a part of the material; as a whole, the CAC-OS functions as a semiconductor. In the case where the CAC-OS or the CAC—metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the conducting function described above, and the insulating regions have the insulating function described above. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred in some cases.

Furthermore, in the CAC-OS, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS includes components having different bandgaps. For example, the CAC-OS includes a component having a wide gap due to an insulating region and a component having a narrow gap due to a conductive region. When carriers flow in this composition, carriers mainly flow in the component having a narrow gap. The component having a narrow gap complements the component having a wide gap, and carriers also flow in the component having a wide gap in conjunction with the component having a narrow gap. Therefore, in the case where the CAC-OS is used in a channel formation region of a transistor, high current drive capability and high field-effect mobility of the OS transistor can be obtained.

A metal oxide semiconductor is classified into a single crystal metal oxide semiconductor and a non-single-crystal metal oxide semiconductor according to crystallinity. Examples of a non-single-crystal metal oxide semiconductor include a c-axis aligned crystalline metal oxide semiconductor (CAAC-OS), a polycrystalline metal oxide semiconductor, a nanocrystalline metal oxide semiconductor (nc-OS), and an amorphous-like metal oxide semiconductor (a-like OS).

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Distortion refers to a portion where the direction of lattice arrangement changes between a region with uniform lattice arrangement and another region with uniform lattice arrangement in a region where the nanocrystals are connected.

The shape of the nanocrystal is basically a hexagon. However, the shape is not always a regular hexagon and is a non-regular hexagon in some cases. A pentagonal lattice arrangement, a heptagonal lattice arrangement, and the like are included in the distortion in some cases. A clear grain boundary cannot be observed even in the vicinity of distortion in the CAAC-OS. That is, formation of a grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like.

The CAAC-OS tends to have a layered crystal structure (also referred to as a layered structure) in which a layer containing indium and oxygen (hereinafter an In layer) and a layer containing an element M, zinc, and oxygen (hereinafter an (M,Zn) layer) are stacked. Indium and the element M can be replaced with each other, and when the element M of the (M,Zn) layer is replaced with indium, the layer can also be referred to as an (In,M,Zn) layer. Furthermore, when indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor depending on the analysis method.

The a-like OS is a metal oxide semiconductor having a structure between those of the nc-OS and the amorphous metal oxide semiconductor. The a-like OS has a void or a low-density region. The a-like OS has lower crystallinity than the nc-OS and the CAAC-OS.

In this specification and the like, a CAC refers to the function or material of a metal oxide semiconductor, and a CAAC refers to the crystal structure of a metal oxide semiconductor.

REFERENCE NUMERALS 10, 11, 12, 13: cell, 20, 22: memory cell, 25: bistable circuit, 30, 31: backup circuit,
51, 52, 53: precharge circuit, 55: sense amplifier, 55a: latch circuit, 56: RS latch circuit, 57, 58, 59: inverter circuit,
100, 101: memory device,
105: PMU,
110, 111: cell array,
120: peripheral circuit, 122: controller, 123: row circuit, 124: column circuit, 125: backup and recovery driver,
131: row decoder, 132: word line driver, 133: column decoder, 134: precharge circuit, 135: local bit line MUX, 135r, 135w: MUX, 136: sense amplifier, 137: write driver, 138: output driver, 150, 151, 152, 153, 154, 155, 156, 157: power switch, 160, 161, 162, 163: power domain,
300: processor, 305: PMU, 306: bus, 311: backup and recovery driver, 320: cache memory, 321: cell array, 322: peripheral circuit, 324: controller, 325: backup and recovery driver, 326: row circuit, 327: column circuit, 330: CPU core, 331: flip-flop, 332: cache memory, 335: scan flip-flop, 335A: clock buffer circuit, 340: backup circuit, 390, 391, 392, 393, 394, 398, 399: power switch,
2010: information terminal, 2011: housing, 2012: display portion, 2013: operation button, 2014: external connection port, 2015: speaker, 2016: microphone, 2051: housing, 2052: display portion, 2053: keyboard, 2054: pointing device, 2070: video camera, 2071: housing, 2072: display portion, 2073: housing, 2074: operation key, 2075: lens, 2076: joint, 2110: portable game machine, 2111: housing, 2112: display portion, 2113: speaker, 2114: LED lamp, 2115: operation button, 2116: connection terminal, 2117: camera, 2118: microphone, 2119: recording medium read portion, 2150: electric refrigerator-freezer, 2151: housing, 2152: refrigerator door, 2153: freezer door, 2170: motor vehicle, 2171: car body, 2172: wheel, 2173: dashboard, 2174: light,
5001, 5002, 5003, 5004: OS transistor,
5009, 5010: oxide layer,
5011, 5012, 5013: metal oxide layer,
5021, 5022, 5023, 5024, 5025, 5026, 5027, 5028, 5029, 5030, 5031, 5032, 5033, 5034: insulating layer,
5050, 5051, 5052, 5053, 5054: conductive layer,
5500: single crystal silicon wafer,
7000: electronic component, 7001: lead, 7002: printed circuit board, 7004: circuit board,
BL, BL1, BL2, BLB, BLB1, BLB2: bit line, LRBL, LRBLB, LWBL, LWBLB: local bit line,
WL, WL1, WL2: word line,
OGL: wiring,
V_VDD, V_VDH, V_VDM, V_VSM: virtual voltage line,
Q, Qb, QS, QSb, SN1, SN2, SN3, SN11, D1, Q1, SD, SD_IN, SE, CK, CK1, CKB1, RT: node,
MN1, MN2, MN3, MP1, MP2, MP3, MP4, MO1, MO2, MO3, MO11, MO12, MO13, MT1, MT2, MT11, MT12, MT13, MT14: transistor,
C1, C2, C3, C11: capacitor,
LX1, LX2, LX3, LX4, LX5, LX6, LX7, LX8, LX9: layer

The invention claimed is:

1. A semiconductor device comprising:
a peripheral circuit provided in a first power domain;
a cell array provided in a second power domain; and
a power management unit that performs power management of the first power domain and the second power domain;
wherein the cell array comprises a memory cell, a backup circuit, a word line, and a bit line pair composed of a first bit line and a second bit line,
wherein the memory cell comprises a bistable circuit including a first node and a second node, a first transfer transistor controlling continuity between the first node and the first bit line, and a second transfer transistor controlling continuity between the second node and the second bit line,
wherein gates of the first transfer transistor and the second transfer transistor are electrically connected to the word line,
wherein the backup circuit, the word line, and the bit line pair are electrically connected to the peripheral circuit,
wherein under control of the power management unit, the peripheral circuit writes and reads data between the memory cell and the backup circuit,
wherein as an operation state, at least first to seventh states are set,
wherein in the first state, data are written to the cell array,
wherein in the second state, data are read from the cell array,
wherein the third state is a standby state,
wherein in the fourth state, the bit line pair is in a floating state,
wherein in the first to fourth states, under control of the power management unit,
a first voltage is applied to the first power domain and a second voltage is applied to the second power domain,
wherein in the fifth state, the bit line pair is in a floating state, and under control of the power management unit, the first voltage is applied to the first power domain and a third voltage that is lower than the second voltage is applied to the second power domain,
wherein in the sixth state, the bit line pair is in a floating state, and under control of the power management unit, the first voltage is applied to the first power domain, and power gating of the second power domain is performed, and
wherein in the seventh state, under control of the power management unit, power gating of the first power domain and the second power domain is performed.

2. The semiconductor device according to claim 1,
wherein in the fourth to sixth states, under control of the power management unit, the peripheral circuit sets the bit line pair to a floating state.

3. The semiconductor device according to claim 1,
wherein under control of the power management unit, an operation sequence for a shift from the fourth state to the fifth state, an operation sequence for a shift from the fifth state to the sixth state, and an operation sequence for a shift from the sixth state to the seventh state are executed.

4. The semiconductor device according to claim 1,
wherein under control of the power management unit, an operation sequence for a shift from the third state to any one operation state of the fourth to seventh states and an operation sequence for a shift from a shifted state to the third state are executed.

5. The semiconductor device according to claim 1,
wherein an operation sequence for a shift from another state to the sixth state or the seventh state includes operation of writing data of the cell array to the backup circuit.

6. The semiconductor device according to claim 1,
wherein an operation sequence for a shift from the seventh state to the third state includes operation of writing data of the backup circuit to the memory cell.

7. The semiconductor device according to claim 1,
wherein in the first to third states, the peripheral circuit applies a first precharge voltage to the bit line pair.

8. The semiconductor device according to claim 1,
wherein in an operation sequence for a shift from the seventh state to the third state, the peripheral circuit applies a second precharge voltage to the first node and the second node.

9. The semiconductor device according to claim 1,
wherein an operation sequence for a shift from another state to the sixth state or the seventh state, the peripheral circuit performs precharge operation of applying a second precharge voltage to the first and the second node.

10. The semiconductor device according to claim 1,
wherein the backup circuit backs up only data of the first node.

11. A semiconductor device comprising a power management unit, first to third power switches, a first power domain, and a second power domain,
wherein the power management unit generates first to seventh control signals,
wherein the first to third control signals control on/off of the first to third power switches, respectively,
wherein the first power switch controls application of a first voltage to the first power domain,
wherein the second power switch and the third power switch control application of a second voltage and a third voltage, respectively, to the second power domain, and the third voltage is lower than the second voltage,
wherein a row circuit, a column circuit, a controller, and a driver are provided in the first power domain,
wherein a cell array is provided in the second power domain,
wherein a memory cell, a first backup circuit, a word line, and a bit line pair composed of a first bit line and a second bit line are provided in the cell array,
wherein the first backup circuit comprises a first retention node, a second retention node, a first capacitor electrically connected to the first retention node, a second capacitor electrically connected to the second retention node, a first transistor controlling continuity between the first retention node and a first node of the memory cell, and a second transistor controlling continuity between the second retention node and a second node of the memory cell, wherein channel formation regions of the first transistor and the second transistor include a metal oxide, wherein the word line is electrically connected to the row circuit, wherein the column circuit comprises a first local bit line pair composed of two local write bit lines, a second local bit line pair composed of two local read bit lines, a first precharge circuit precharging the bit line pair to a first precharge voltage, a second precharge circuit precharging the bit line pair to a second precharge voltage, a write driver writing data to the first local bit line pair, a sense amplifier detecting data of the second local bit line pair, a first switch circuit controlling continuity between the bit line pair and the first local bit line pair, and a second switch circuit controlling continuity between the bit line pair and the second local bit line pair, wherein the driver controls on/off of the first and second transistors on the basis of the fourth control signal, wherein whether the controller or the power management unit controls the row circuit is determined by the fifth control signal, wherein the column circuit controls operation of the first and second precharge circuits on the basis of the sixth control signal, and wherein the column circuit controls on/off operation of the first and second switch circuits on the basis of the seventh control signal.

12. The semiconductor device according to claim 11, wherein the cell array includes a second backup circuit instead of the first backup circuit, wherein only data of the first node are written to the second backup circuit, wherein the second backup circuit includes a third retention node, a third capacitor electrically connected to the third retention node, and a third transistor, wherein the third transistor controls continuity between the third retention node and the first node of the memory cell, wherein a channel formation region of the third transistor includes a metal oxide, and wherein the driver controls on/off of the third transistor on the basis of the fourth control signal.

13. The semiconductor device according to claim 11, comprising:
a processor core;
a bus for data transmission between [Ethel] a memory cell array and the processor core; and
a fourth power switch controlling application of a fourth voltage to the processor core,
wherein the power management unit generates an eighth control signal for controlling on/off of the fourth power switch.

14. An electronic component comprising a chip and a lead,
wherein the lead is electrically connected to the chip, and
wherein the semiconductor device according to claim 11 is provided on the chip.

15. An electronic device comprising:
the electronic component according to claim 14; and
at least one of a display portion, a touch sensor, a microphone, a speaker, an operation key, and a housing.

16. An operation method of a semiconductor device comprising a power management unit performing power management of a first power domain and a second power domain, wherein a peripheral circuit is provided in the first power domain, wherein a cell array is provided in the second power domain, wherein the cell array comprises a memory cell, a backup circuit electrically connected to the memory cell, a word line electrically connected to the peripheral circuit, and a bit line pair that is composed of a first bit line and a second bit line and is electrically connected to the peripheral circuit, wherein the memory cell comprises a bistable circuit including a first node and a second node, a first transfer transistor controlling continuity between the first node and the first bit line, and a second transfer transistor controlling continuity between the second node and the second bit line, wherein gates of the first transfer transistor and the second transfer transistor are electrically connected to the word line, wherein in first to fourth states, under control of the power management unit, a first voltage and a second voltage are applied to the first power domain and the second power domain, respectively, wherein in the first state, data are written to the memory cell by the peripheral circuit, wherein in the second state, data are read from the memory cell by the peripheral circuit, wherein in the third state, a memory device is in a standby state, and the power management unit controls a column circuit to precharge the bit line pair to a third voltage, wherein in the fourth state, the power management unit controls the peripheral circuit to bring the bit line pair into a floating state, wherein in a fifth state, under control of the power management unit, the first voltage and a fourth voltage are applied to the first power domain and the second power domain, and the fourth voltage is lower than the second voltage, wherein in a sixth state, under control of the power management unit, the first voltage is applied to the first power domain and power gating of the second power domain is performed, wherein in a seventh state, under control of the power management unit, power gating of the first power domain and the second power domain is performed, wherein before a shift from the third state or the fifth state to the sixth state, the power management unit controls the peripheral circuit to execute first backup operation of writing data of a memory cell array to the backup circuit, and wherein before a shift from the sixth state to the seventh state, the power management unit controls the peripheral circuit to execute second backup operation of writing data of the backup circuit again.

17. The operation method of a semiconductor device, according to claim 16,
wherein before a shift from the sixth state to the third state, the power management unit controls the peripheral circuit to execute first recovery operation of writing data of the backup circuit to the memory cell, and
wherein before a shift from the seventh state to the third state, the power management unit controls the peripheral circuit to execute second recovery operation of writing data of the backup circuit to the memory cell.

18. The operation method of a semiconductor device, according to claim 16, wherein in the fifth state, the power management unit performs control for applying a voltage lower than the fourth voltage to the second power domain when time during which the fourth voltage is applied to the second power domain exceeds first set time.

19. The operation method of a semiconductor device, according to claim 18,
wherein when time of the third state exceeds second set time, the power management unit controls the peripheral circuit and shifts an operation state to the fourth state.

20. The operation method of a semiconductor device, according to claim 19,
wherein when time of the fourth state exceeds third set time, the power management unit controls the peripheral circuit and shifts the operation state to the fifth state.

21. The operation method of a semiconductor device, according to claim 20,
wherein when time of the fifth state exceeds fourth set time, the power management unit controls the peripheral circuit, executes the first backup operation, and shifts the operation state to the sixth state.

22. The operation method of a semiconductor device, according to claim 21,
wherein when time of the sixth state exceeds fifth set time, the power management unit controls the peripheral circuit, executes the second backup operation, and then shifts the operation state to the seventh state.

23. An operation method of the semiconductor device according to claim 11,
wherein the power management unit generates the first to seventh control signals to switch between first to fifth states,
wherein the first state is a standby state, the first to third power switches are on, a fourth power switch is off, the first precharge voltage is applied to the bit line pair by the first precharge circuit, the second precharge circuit is off, and the first and second switch circuits are on,
wherein for a shift from the first state to the second state, the first precharge circuit and the first and second switch circuits are turned off,
wherein for a shift from the second state to the third state, the third power switch is turned off and the fourth power switch is turned on, wherein in the fourth state, the first and second power switches are on, the third and fourth power switches are off, the first and second precharge circuits and the first and second switch circuits are off,
wherein in the fifth state, the first to fourth switches are off,
wherein an operation sequence for a shift from the third state to the fourth state comprises turning on the third power switch, turning off the fourth power switch, turning on the first and second transistors, and turning off the first and second transistors, and then turning off the third power switch, and
wherein an operation sequence for a shift from the fourth state to the fifth state comprises turning on the first and second transistors, turning on the third power switch, and turning off the first and second transistors, and then turning off the first to fourth power switches.

24. The operation method of the semiconductor device, according to claim 23,
wherein an operation sequence for a shift from the fourth state to the first state comprises turning on the first and second transistors, turning on the third power switch, and turning off the first and second transistors, and then applying the first precharge voltage to the bit line pair by the first precharge circuit, and turning on the first and second switch circuits.

25. The operation method of the semiconductor device, according to claim 23,
wherein as an operation sequence for a shift from the fifth state to the first state, the first and second power switches are turned on, the first and second switch circuits are turned off, the second precharge voltage is applied to the bit line pair by the second precharge circuit, the row circuit sets the word line to a selected state in accordance with the fifth control signal, after the word line is made in a non-selected state, the first and second transistors are turned on, the third power switch is turned on, and after the first and second transistors are turned off, the first precharge voltage is applied to the bit line pair by the first precharge circuit, and the first and second switch circuits are turned on.

* * * * *